US012575148B2

(12) United States Patent
Park et al.

(10) Patent No.: US 12,575,148 B2
(45) Date of Patent: Mar. 10, 2026

(54) SEMICONDUCTOR DEVICE

(71) Applicant: Samsung Electronics Co., Ltd.,
Suwon-si (KR)

(72) Inventors: Jun Ki Park, Suwon-si (KR); Wan Don Kim, Suwon-si (KR); Jeong Hyuk Yim, Suwon-si (KR); Hyo Seok Choi, Suwon-si (KR); Sung Hwan Kim, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 315 days.

(21) Appl. No.: 18/353,276

(22) Filed: Jul. 17, 2023

(65) Prior Publication Data

US 2024/0154042 A1     May 9, 2024

(30) Foreign Application Priority Data

Nov. 3, 2022     (KR) ......................... 10-2022-0145161

(51) Int. Cl.
*H10D 62/13* (2025.01)
*H10D 30/00* (2025.01)
(Continued)

(52) U.S. Cl.
CPC ......... *H10D 62/151* (2025.01); *H10D 30/501* (2025.01); *H10D 62/121* (2025.01); *H10D 64/254* (2025.01); *H10D 64/256* (2025.01)

(58) Field of Classification Search
CPC ............. H01L 29/78696; H01L 29/785; H01L 29/78618; H01L 29/42392;
(Continued)

(56) References Cited

U.S. PATENT DOCUMENTS 10,734,412 B2 * 8/2020 Glass ................... H10D 64/254
11,201,221 B2 * 12/2021 Morrow ............. H10D 30/6219
(Continued)

FOREIGN PATENT DOCUMENTS

KR     10-2022-0080855 A     6/2022
KR          20220080302 A  *  6/2022   ......... H10D 30/6735
(Continued)

*Primary Examiner* — Earl N Taylor
(74) *Attorney, Agent, or Firm* — Wolf, Greenfield & Sacks, P.C.

(57) ABSTRACT

A semiconductor device includes a substrate including an upper surface and a lower surface that are opposite to each other in a first direction, an active pattern which is on the upper surface of the substrate and extends in a second direction, a gate electrode which is on the active pattern and extends in a third direction, a first source/drain pattern which is connected to the active pattern on the upper surface of the substrate, and includes a lower epitaxial region and an upper epitaxial region, the upper epitaxial region including an epitaxial recess, and the lower epitaxial region being inside the epitaxial recess, a first source/drain contact, which is connected to the first source/drain pattern and extends into the substrate, and a contact silicide layer, which is between the first source/drain contact and the first source/drain pattern and contacts the lower epitaxial region.

20 Claims, 35 Drawing Sheets

(51) Int. Cl.
  H10D 62/10 (2025.01)
  H10D 64/23 (2025.01)
(58) Field of Classification Search
  CPC ............. H01L 29/41791; H01L 29/165; H01L
    29/0847; H01L 29/0673; H01L 27/0924;
    H10D 30/6757; H10D 30/6219; H10D
    30/6735; H10D 62/121; H10D 30/62;
    H10D 62/822; H10D 62/151; H10D
    84/853; H10D 30/6713; H10D
    30/501–509; H10D 64/254; H10D 64/256
  See application file for complete search history.

(56) References Cited

U.S. PATENT DOCUMENTS

| 11,222,892 | B2 * | 1/2022 | Su | H10D 30/6757 |
| 11,355,601 | B2 * | 6/2022 | Chiang | H10D 62/121 |
| 11,362,213 | B2 * | 6/2022 | Ju | H10D 30/6211 |
| 11,424,332 | B2 * | 8/2022 | Yu | H01L 21/7624 |
| 11,532,714 | B2 * | 12/2022 | Yu | H10D 30/6219 |
| 11,588,050 | B2 * | 2/2023 | Yu | H10D 30/014 |
| 11,615,987 | B2 * | 3/2023 | Huang | H01L 21/76831 |
| | | | | 257/401 |
| 11,658,220 | B2 * | 5/2023 | Su | H10D 62/151 |
| | | | | 257/401 |
| 2021/0074823 | A1 * | 3/2021 | Glass | H10D 48/30 |
| 2022/0130970 | A1 * | 4/2022 | Kang | H01L 21/76224 |
| 2022/0130991 | A1 | 4/2022 | Yu et al. | |
| 2022/0165659 | A1 * | 5/2022 | Huang | H01L 21/76849 |
| 2022/0181500 | A1 * | 6/2022 | Ha | H10D 64/015 |
| 2022/0208679 | A1 * | 6/2022 | Lee | H10D 62/118 |
| 2022/0285493 | A1 * | 9/2022 | Kim | H10D 30/0212 |
| 2022/0352326 | A1 * | 11/2022 | Huang | H10D 64/017 |
| 2023/0011153 | A1 * | 1/2023 | Kim | H10D 30/6735 |
| 2023/0163076 | A1 * | 5/2023 | Park | H01L 21/76805 |
| | | | | 257/330 |
| 2023/0268389 | A1 * | 8/2023 | Jain | H10D 30/6735 |
| | | | | 257/288 |
| 2024/0006522 | A1 * | 1/2024 | Park | H10D 30/507 |
| 2024/0136430 | A1 * | 4/2024 | Shin | H10D 30/6735 |
| 2024/0243171 | A1 * | 7/2024 | Kim | H10D 30/6713 |
| 2024/0413203 | A1 * | 12/2024 | Yoe | H10D 30/6757 |

FOREIGN PATENT DOCUMENTS

| KR | 10-2022-0130352 | A | | 9/2022 | |
| KR | 20230028920 | A | * | 3/2023 | H10D 62/115 |

* cited by examiner

SEMICONDUCTOR DEVICE

CROSS-REFERENCE TO RELATED APPLICATION

This application claims priority from Korean Patent Application No. 10-2022-0145161 filed on Nov. 3, 2022, in the Korean Intellectual Property Office, and all the benefits accruing therefrom under 35 U.S.C. 119, the content of which is herein incorporated by reference in its entirety.

BACKGROUND

1. Technical Field

The present disclosure relates to a semiconductor device.

2. Description of the Related Art

As one of the scaling technologies for increasing density of a semiconductor device, a multi gate transistor in which a multi-channel active pattern (or a silicon body) having a fin or nanowire shape is formed on a substrate and a gate is formed on a surface of the multi-channel active pattern has been proposed.

Because such a multi gate transistor uses a three-dimensional channel, scaling is relatively easily performed. Further, even if a gate length of the multi gate transistor is not increased, the current control capability may be improved. Furthermore, a SCE (short channel effect) in which the potential of a channel region is influenced by a drain voltage may be effectively suppressed.

On the other hand, as a pitch size of a semiconductor device becomes smaller, there is a need for research about reducing the capacitance between contacts in the semiconductor device and ensuring electrical stability.

SUMMARY

Aspects of the present disclosure provide a semiconductor device capable of improving element performance and reliability.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor device comprising a substrate including an upper surface and a lower surface that are opposite to each other in a first direction, an active pattern, which is on the upper surface of the substrate and extends in a second direction, a gate electrode, which is on the active pattern and extends in a third direction, a first source/drain pattern, which is connected to the active pattern on the upper surface of the substrate, and includes a lower epitaxial region and an upper epitaxial region, the upper epitaxial region including an epitaxial recess, and the lower epitaxial region being inside the epitaxial recess, a first source/drain contact, which is connected to the first source/drain pattern and extends into the substrate, and a contact silicide layer, which is between the first source/drain contact and the first source/drain pattern and contacts the lower epitaxial region.

According to another aspect of the present disclosure, there is provided a semiconductor device comprising a substrate including an upper surface and a lower surface that are opposite to each other in a first direction, an active pattern, which is on the upper surface of the substrate and extends in a second direction, a gate electrode, which is on the active pattern and extends in a third direction, a first source/drain pattern, which is connected to the active pattern on the upper surface of the substrate, and includes a first lower epitaxial region, a first upper epitaxial region, and an inserted epitaxial region, the inserted epitaxial region being between the first lower epitaxial region and the first upper epitaxial region, a first source/drain contact, which is connected to the first source/drain pattern and extends into the substrate, and a contact silicide layer, which is between the first source/drain contact and the first source/drain pattern, and contacts the first lower epitaxial region, wherein a concentration of dopant included in the inserted epitaxial region is lower than a concentration of dopant included in the first upper epitaxial region and a concentration of dopant included in the first lower epitaxial region.

According to still another aspect of the present disclosure, there is provided a semiconductor device comprising a substrate including an upper surface and a lower surface that are opposite in a first direction, a lower pattern, which protrudes from the upper surface of the substrate, a sheet pattern which is spaced apart from the lower pattern in the first direction, and includes a first end and a second end, a gate electrode, which extends in a second direction on the upper surface of the substrate, and at least partially wraps the sheet pattern, a first source/drain pattern, which is in contact with the lower pattern, connected to the first end of the sheet pattern, and includes a first lower epitaxial region and a first upper epitaxial region, the first upper epitaxial region including an epitaxial recess, and the first lower epitaxial region being inside the epitaxial recess, a second source/drain pattern, which is in contact with the lower pattern and connected to the second end of the sheet pattern, and includes a second lower epitaxial region, and a second upper epitaxial region on the second lower epitaxial region, a first source/drain contact, which is connected to the first source/drain pattern and extends into the substrate, a second source/drain contact, which is on the upper surface of the substrate and connected to the second source/drain pattern, a first contact silicide layer, which is between the first source/drain contact and the first source/drain pattern, and contacts with the first lower epitaxial region, and a second contact silicide layer, which is between the second source/drain contact and the second source/drain pattern, and contacts the second upper epitaxial region.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Figure 1:
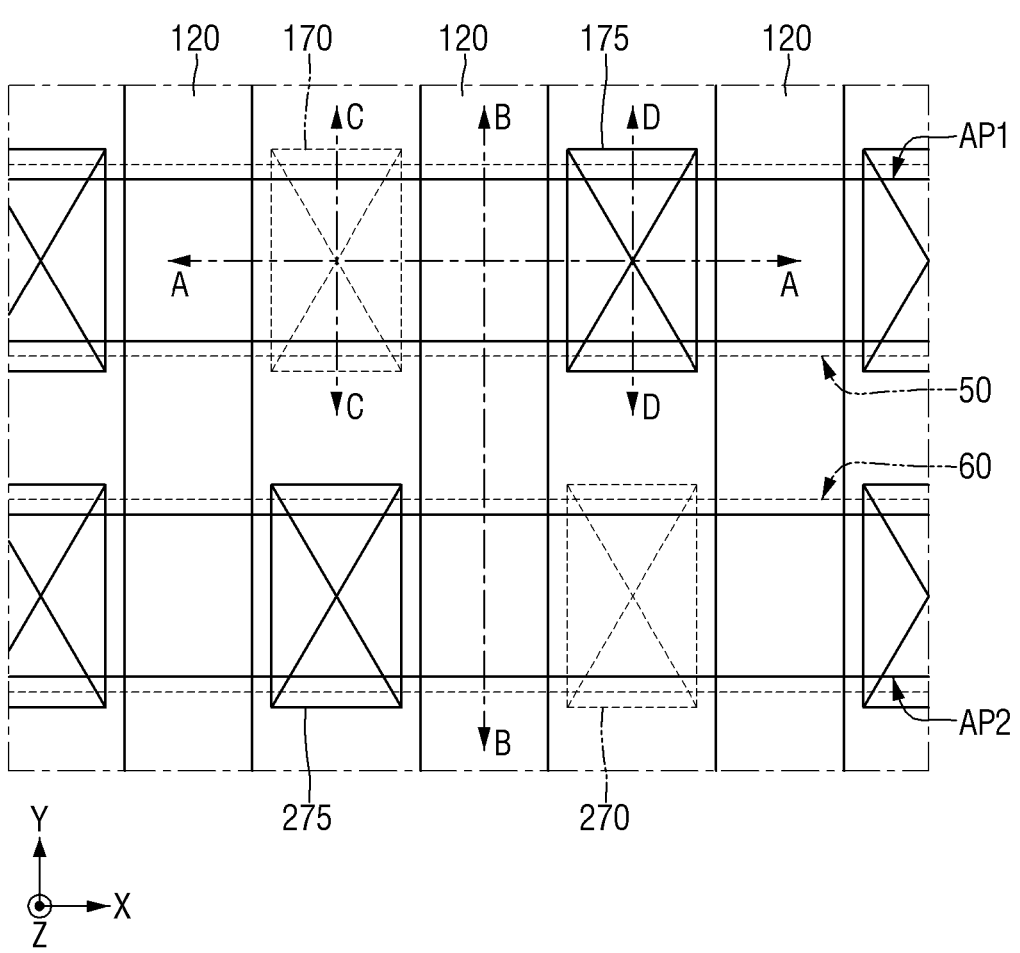
FIG. 1 is an example layout diagram that illustrates a semiconductor device according to some embodiments.

Hereinafter, example embodiments will be described with reference to the accompanying drawings. The same reference numerals are used for the same components in the drawings, and duplicate descriptions thereof are omitted. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination. In the present specification, although terms such as first and second are used to describe various elements or components, it goes without saying that these elements or components are not limited by these terms. These terms are only used to distinguish a single element or component from other elements or components. Therefore, it goes without saying that a first element or component referred to below may be a second element or component within the technical idea of embodiments of the present inventive concept.

Although drawings of a semiconductor device according to some embodiments show a transistor including a nanowire or a nanosheet, and a MBCFET™ Multi-Bridge Channel Field Effect Transistor) as an example, the embodiments are not limited thereto. The semiconductor device according to some embodiments may, of course, be applied to a fin-type transistor (FinFET) including a channel region of a fin-type pattern shape.

The semiconductor device according to some embodiments may include a tunneling transistor (tunneling FET), a three-dimensional (3D) transistor or a vertical transistor (vertical FET). The semiconductor device according to some embodiments may, of course, include a planar transistor. In addition, the embodiments of the inventive concept may be applied to a transistor based on two-dimensional material (2D material based FETs) and a heterostructure thereof.

Further, the semiconductor device according to some embodiments may also include a bipolar junction transistor, a laterally diffused metal oxide semiconductor (LDMOS), or the like.

The semiconductor device according to some embodiments will be described with reference to FIGS. 1 to 6.

Figure 2:
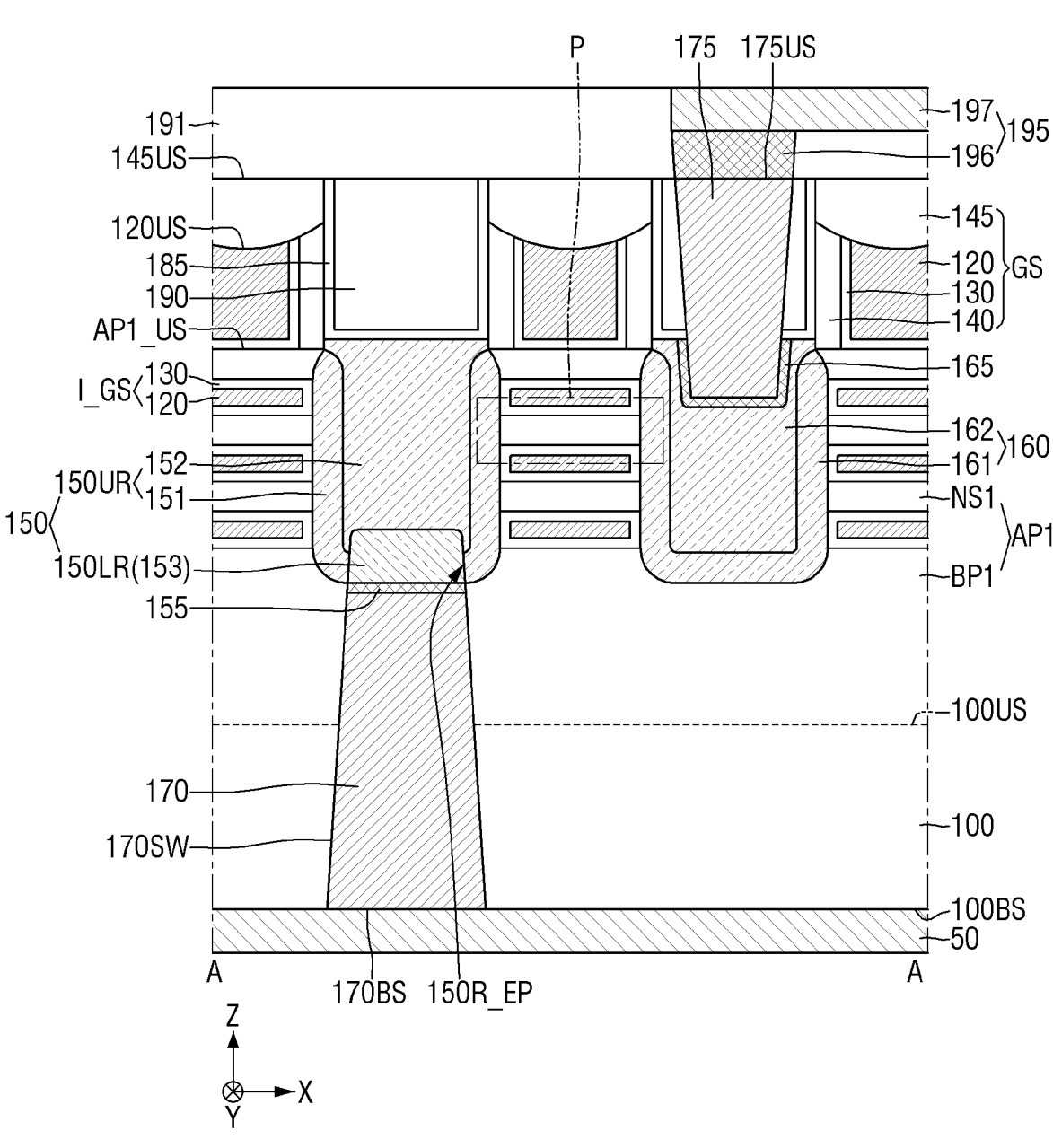
FIG. 2 is a cross-sectional view taken along line A-A of FIG. 1.
Figure 3:
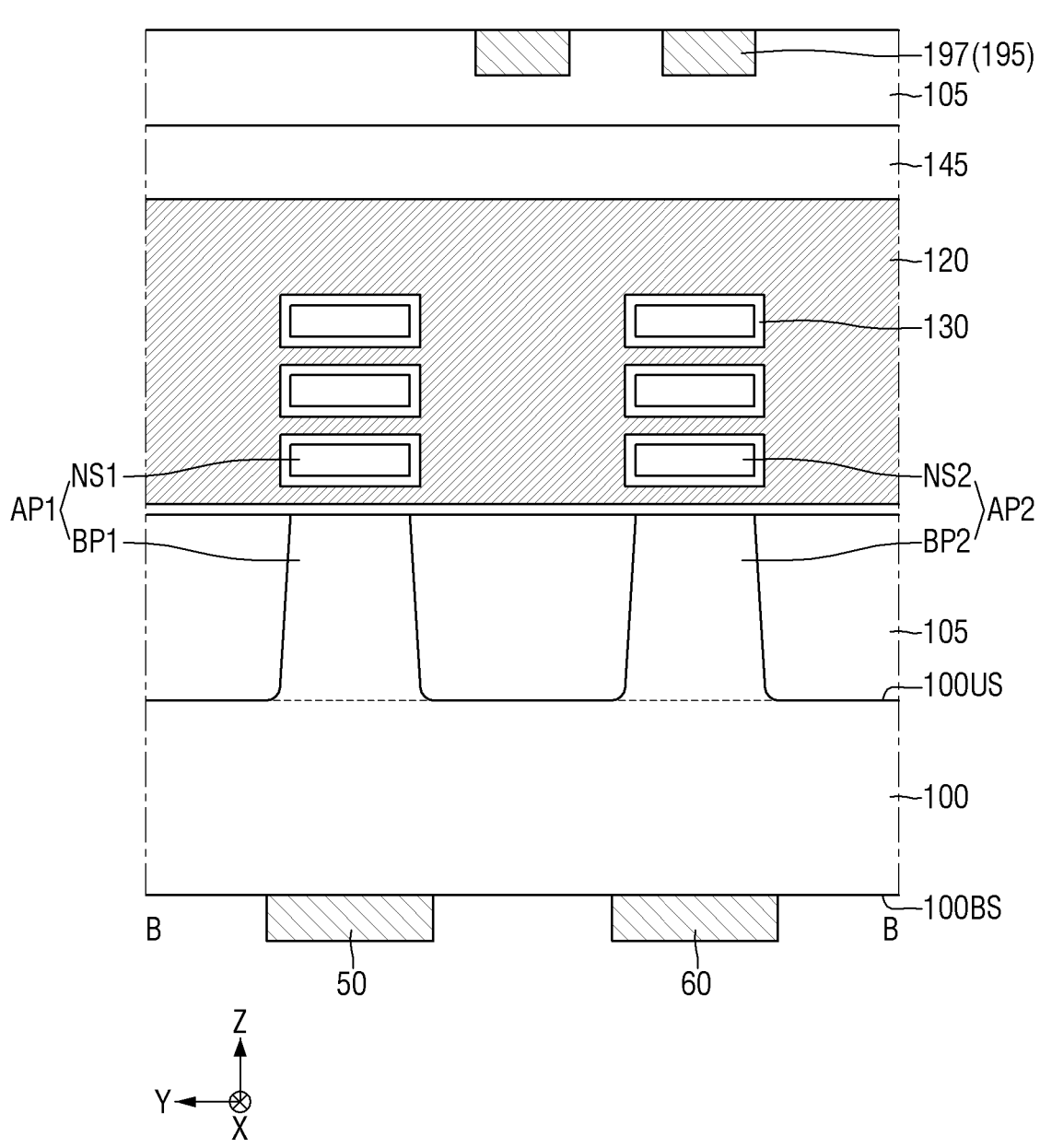
FIG. 3 is a cross-sectional view taken along line B-B of FIG. 1.
Figure 4:
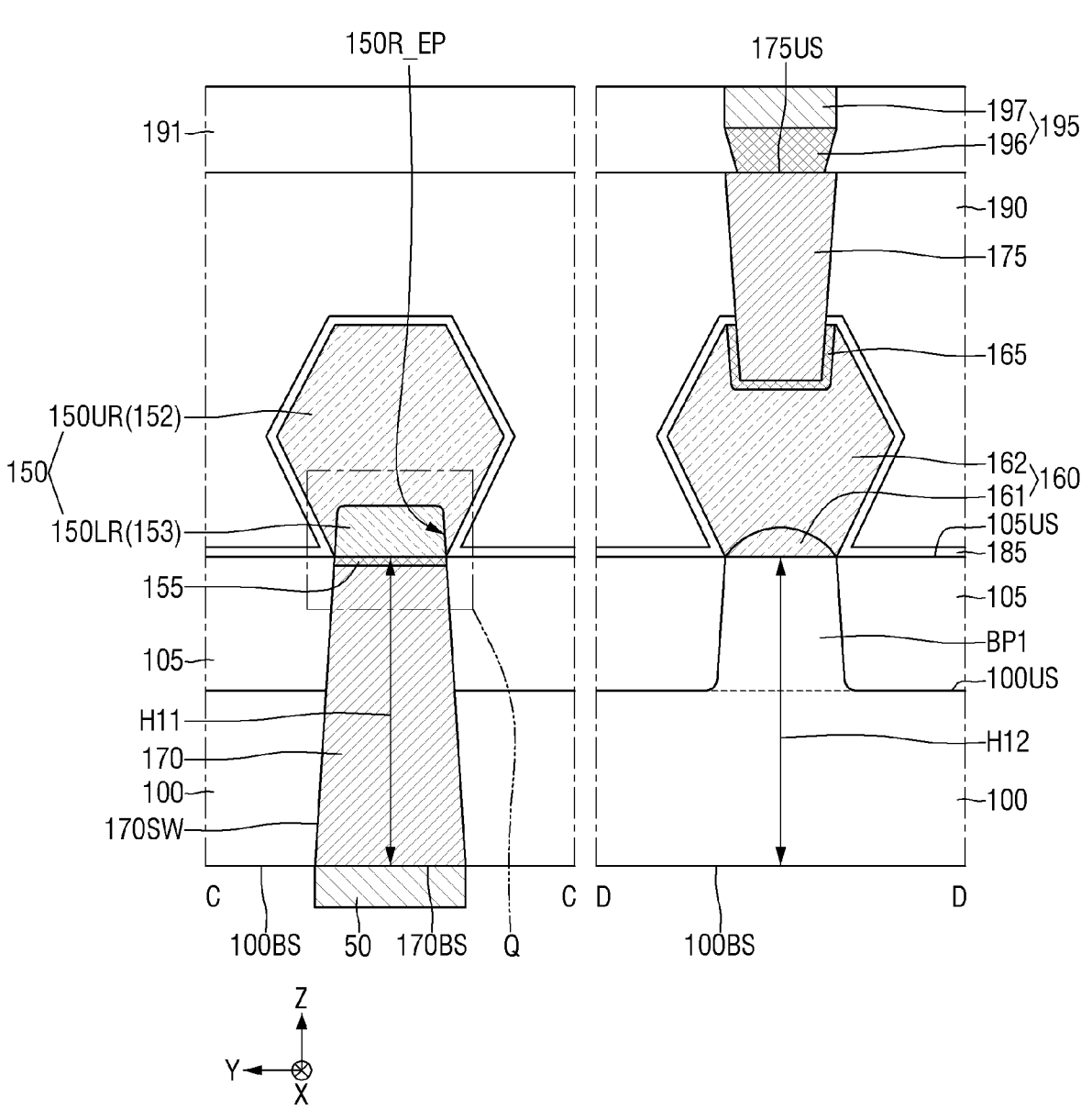
FIG. 4 is a cross-sectional view taken along lines C-C and D-D of FIG. 1.
Figure 5:
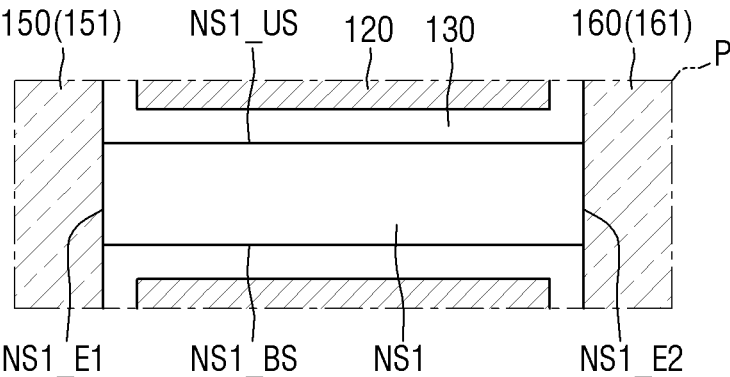
FIG. 5 is an enlarged view of a portion P of FIG. 2.
Figure 6:
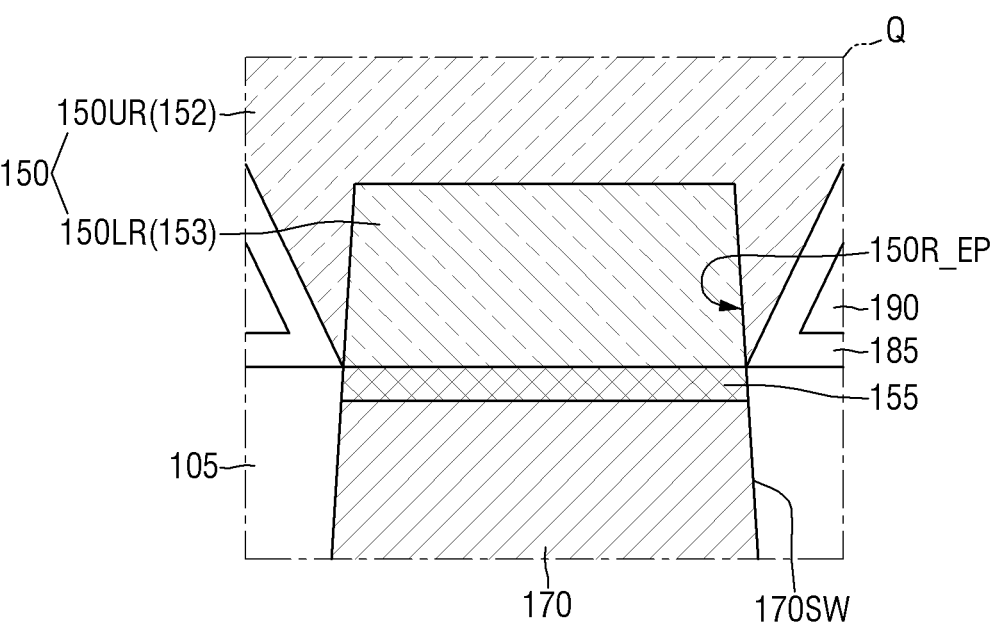
FIG. 6 is an enlarged view of a portion Q of FIG. 4.

FIG. 1 is an example layout diagram that illustrates a semiconductor device according to some embodiments. FIG. 2 is a cross-sectional view taken along line A-A of FIG. 1. FIG. 3 is a cross-sectional view taken along line B-B of FIG. 1. FIG. 4 is a cross-sectional view taken along lines C-C and D-D of FIG. 1. FIG. 5 is an enlarged view of a portion P of FIG. 2. FIG. 6 is an enlarged view of a portion Q of FIG. 4. For convenience of explanation, FIG. 1 does not show a wiring structure 195.

Although not shown, a cross-sectional view taken in a first direction X along a second active pattern AP2 may be similar to that of FIG. 2.

Referring to FIGS. 1 to 6, the semiconductor device according to some embodiments may include a first active pattern AP1, a second active pattern AP2, a plurality of gate electrodes 120, a first source/drain pattern 150, a second source/drain pattern 160, a first power source/drain contact 170, a second power source/drain contact 270, a first source/drain contact 175, and a second source/drain contact 275.

The substrate 100 may include an upper surface 100US and a lower surface 100BS that are opposite to each other in a third direction Z. The substrate 100 may be a bulk silicon or a silicon on insulator (SOI). In contrast, the substrate 100 may be a silicon substrate, or may include, but is not limited to, other materials, for example, silicon germanium, silicon germanium on insulator (SGOI), indium antimonide, lead tellurium compounds, indium arsenic, indium phosphate, gallium arsenide, and/or antimonide gallium.

The first active pattern AP1 and the second active pattern AP2 may be disposed on the substrate 100, respectively. For example, the first active pattern AP1 and the second active pattern AP2 may be disposed on the upper surface 100US of the substrate. Each of the first active pattern AP1 and the second active pattern AP2 may extend lengthwise in the first direction X.

The first active pattern AP1 and the second active pattern AP2 may be disposed to be spaced apart in a second direction Y. The first active pattern AP1 and the second active pattern AP2 may be adjacent to each other in the second direction Y.

Although the first active pattern AP1 is shown to be closest to the second active pattern AP2 in the second direction Y, example embodiments are not limited thereto. In other embodiments, additional active patterns may be disposed between the first active pattern AP1 and the second active pattern AP2.

As an example, the first active pattern AP1 may be a region in which a p-type transistor is formed, and the second active pattern AP2 may be a region in which an n-type transistor is formed. As another example, the first active pattern AP1 and the second active pattern AP2 may be regions in which the p-type transistor is formed. As yet another example, the first active pattern AP1 and the second active pattern AP2 may be regions in which the n-type transistor is formed. Hereinafter, example embodiments will be described in which the first active pattern AP1 and the second active pattern AP2 are regions in which transistors of different conductivity types are formed.

The first active pattern AP1 and the second active pattern AP2 may each be multi-channel active patterns. For example, the first active pattern AP1 may include a first lower pattern BP1 and a plurality of first sheet patterns NS1. The second active pattern AP2 may include a second lower pattern BP2 and a plurality of second sheet patterns NS2. In the semiconductor device according to some embodiments, the first and second active patterns AP1 and AP2 may each be active patterns including nanosheets or nanowires.

The first lower pattern BP1 and the second lower pattern BP2 may each protrude from the substrate 100. For example, the first lower pattern BP1 and the second lower pattern BP2 may each protrude from the upper surface 100US of the substrate. Each of the first lower pattern BP1 and the second lower pattern BP2 may have a fin-like pattern shape.

The first lower pattern BP1 may be spaced apart from the second lower pattern BP2 in the second direction Y. The first lower pattern BP1 and the second lower pattern BP2 may be separated by a fin trench extending in the first direction X. The upper surface 100US of the substrate may be a bottom surface of the fin trench.

The plurality of first sheet patterns NS1 may be disposed on the first lower pattern BP1. The plurality of first sheet patterns NS1 may be spaced apart from the first lower patterns BP1 in the third direction Z. The plurality of first sheet patterns NS1 may be disposed on the upper surface 100US of the substrate.

The plurality of second sheet patterns NS2 may be disposed on the second lower pattern BP2. The plurality of second sheet patterns NS2 may be spaced apart from the second lower patterns BP2 in the third direction Z. The plurality of second sheet patterns NS2 may be disposed on the upper surface 100US of the substrate.

Here, the first direction X may intersect the second direction Y and the third direction Z. Also, the second direction Y may intersect the third direction Z. The third direction Z may be a thickness direction of the substrate 100.

Although three first sheet patterns NS1 and three second sheet patterns NS2 are each shown to be disposed in the third direction Z, this is only for convenience of explanation, and the embodiments are not limited thereto.

In FIGS. 2 and 5, the first sheet pattern NS1 may include an upper surface NS1_US and a lower surface NS1_BS. The upper surface NS1_US of the first sheet pattern is opposite to the lower surface NS1_BS of the first sheet pattern in the third direction Z. The lower surface NS1_BS of the first sheet pattern may face the substrate 100.

The first sheet pattern NS1 may include a first end NS1_E1 and a second end NS1_E2. The first end NS1_E1 of the first sheet pattern is spaced apart from the second end NS1_E2 of the first sheet pattern in the first direction X. The first end NS1_E1 of the first sheet pattern and the second end NS1_E2 of the first sheet pattern may each be portions connected to the source/drain patterns 150 and 160 which will be described below.

The first sheet pattern NS1 may include a first uppermost sheet pattern that is farthest from the substrate 100. The upper surface AP1_US of the first active pattern may be an upper surface of the first uppermost sheet pattern among the first sheet patterns NS1. The description regarding the second active pattern AP2 and the second sheet pattern NS2 may be substantially the same as the description regarding the first active pattern AP1 and the first sheet pattern NS1.

Each of the first lower pattern BP1 and the second lower pattern BP2 may be formed by etching a part of the substrate 100, and may include an epitaxial layer grown from the substrate 100. Each of the first lower pattern BP1 and the second lower pattern BP2 may include silicon or germanium, which is an elemental semiconductor material. Further, each of the first lower pattern BP1 and the second lower pattern BP2 may include a compound semiconductor, and may include, for example, a group IV-IV compound semiconductor or a group III-V compound semiconductor.

The group IV-IV compound semiconductor may be, for example, a binary compound and a ternary compound including at least two elements, such as carbon (C), silicon (Si), germanium (Ge), and tin (Sn) or compounds obtained by doping these elements with group IV elements.

The group III-V compound semiconductor may be, for example, at least one of a binary compound, a ternary compound or a quaternary compound formed by combining at least one of aluminum (Al), gallium (Ga) and/or indium (In) as a group III element with one of phosphorus (P), arsenic (As) and antimony (Sb) as a group V element.

Each of the first sheet pattern NS1 and the second sheet pattern NS2 may include silicon and/or germanium, which is an elemental semiconductor material, a group IV-IV compound semiconductor, or a group III-V compound semiconductor. A width of the first sheet pattern NS1 in the second direction Y may increase or decrease in proportion to the width of the first lower pattern BP1 in the second direction Y. The width of the second sheet pattern NS2 in the second direction Y may increase or decrease in proportion to the width of the second lower pattern BP2 in the second direction Y.

The first sheet pattern NS1 will be described an example. Although the widths in the second direction Y of each of the first sheet patterns NS1 disposed on the first lower pattern BP1 are shown as being the same, the embodiments are not limited thereto.

A field insulating layer 105 may be disposed on the upper surface 100US of the substrate. The field insulating layer 105 may at least partially fill the fin trench that separates the first lower pattern BP1 and the second lower pattern BP2.

The field insulating layer 105 may be disposed on the substrate 100 between the first lower pattern BP1 and the second lower pattern BP2. The field insulating layer 105 may contact the first lower pattern BP1 and the second lower pattern BP2.

As an example, the field insulating layer 105 may entirely cover side walls of the first lower pattern BP1 and side walls of the second lower pattern BP2. Unlike the shown example, as another example, the field insulating layer 105 may partially cover the side walls of the first lower pattern BP1 and/or the side walls of the second lower pattern BP2. For example, a part of the first lower pattern BP1 and/or a part of the second lower pattern BP2 may protrude in the third direction Z beyond the upper surface 105US of the field insulating layer. The field insulating layer 105 does not cover the upper surface of the first lower pattern BP1 and the upper surface of the second lower pattern BP2 in the Z direction as shown in FIG. 3. Each first sheet pattern NS1 and each second sheet pattern NS2 are disposed to be higher than the upper surface 105US of the field insulating layer.

The field insulating layer 105 may include, for example, an oxide layer, a nitride layer, an oxynitride layer or a combination thereof. Although the field insulating layer 105 is shown to be a single layer, embodiments are not limited thereto. Unlike the shown example, the field insulating layer 105 may include a field liner extending along the side walls and a bottom surface of the fin trench, and a field filling layer on the field liner.

A plurality of gate structures GS may be disposed on the upper surface 100US of the substrate. Each gate structure GS may extend in the second direction Y. The gate structures GS may be disposed to be spaced apart in the first direction X. The gate structures GS may be adjacent to each other in the first direction X.

The gate structure GS may be disposed on the first active pattern AP1 and the second active pattern AP2. The gate structure GS may intersect the first active pattern AP1 and the second active pattern AP2.

The gate structure GS may intersect the first lower pattern BP1 and the second lower pattern BP2. The gate structure GS may wrap each first sheet pattern NS1 as shown in FIG. 3. The gate structure GS may wrap each second sheet pattern NS2 as shown in FIG. 3.

Although the gate structure GS is shown to be disposed over the first active pattern AP1 and the second active pattern AP2, this is only for convenience of explanation, and embodiments are not limited thereto. That is, a part of the gate structure GS is separated into two portions by the gate isolation structure disposed on the field insulating layer 105, and disposed on the first active pattern AP1 and the second active pattern AP2.

The gate structure GS1 may include, for example, a gate electrode 120, a gate insulating layer 130, a gate spacer 140, and a gate capping pattern 145.

The gate structure GS may include a plurality of inner gate structures I_GS disposed between the first sheet patterns NS1 adjacent in the third direction Z, and between the first lower pattern BP1 and the first sheet pattern NS1. The inner gate structure I_GS may be disposed between the upper surface of the first lower pattern BP1 and the lower surface NS1_BS of the first sheet pattern, and between the upper surface NS1_US of the first sheet pattern and the lower surface NS1_B S of the first sheet pattern facing each other in the third direction Z.

The number of inner gate structures I_GS may be the same as the number of first sheet patterns NS1. The inner gate structure I_GS contacts the upper surface BP1_US of the first lower pattern, the upper surface NS1_US of the first sheet pattern, and the lower surface NS1_BS of the first sheet pattern. In the semiconductor devices according to some embodiments, the inner gate structure I_GS may come into contact source/drain patterns 150 and 160, which will be described below.

The inner gate structure I_GS includes a gate electrode 120 and a gate insulating layer 130 disposed between adjacent first sheet patterns NS1, and between the first lower pattern BP1 and the first sheet pattern NS1.

Although not shown, the inner gate structure I_GS may be disposed between the second sheet patterns NS2 adjacent in the third direction Z, and between the second lower pattern BP2 and the second sheet pattern NS2.

The gate electrode 120 may be disposed on the first lower pattern BP1. The gate electrode 120 may intersect the first lower pattern BP1. The gate electrode 120 may wrap the first sheet pattern NS1.

Although the upper surface 120US of the gate electrode is shown to be a concave curved surface in a cross-sectional view such as FIG. 2, the embodiments are not limited thereto. In other embodiments, the upper surface 120US of the gate electrode may be a planar surface.

The gate electrode 120 may include one or more materials, such as metal, metal alloy, conductive metal nitride, metal silicide, doped semiconductor material, conductive metal oxide, and/or conductive metal oxynitride. The gate electrode 120 may include, but is not limited to, for example, at least one of titanium nitride (TiN), tantalum carbide (TaC), tantalum nitride (TaN), titanium silicon nitride (Ti-SiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. The conductive metal oxide and the conductive metal oxynitride may include, but are not limited to, oxidized forms of the aforementioned materials.

The gate insulating layer 130 may extend along the upper surface 105US of the field insulating layer, the upper surface of the first lower pattern BP1, and the upper surface of the second lower pattern BP2. The gate insulating layer 130 may wrap the plurality of first sheet patterns NS1 as shown in FIG. 3. The gate insulating layer 130 may wrap the plurality of second sheet patterns NS2 as shown in FIG. 3. The gate insulating layer 130 may be disposed along the periphery of the first sheet pattern NS1 and the periphery of the second sheet pattern NS2. The gate electrode 120 is disposed on the gate insulating layer 130.

The gate insulating layer 130 is disposed between the gate electrode 120 and the first sheet pattern NS1, and between the gate electrode 120 and the second sheet pattern NS2. In the semiconductor device according to some embodiments, the gate insulating layer 130 included in the inner gate structure I_GS may come into contact with the source/drain patterns 150 and 160, which will be described below.

The gate insulating layer 130 may include silicon oxide, silicon oxynitride, silicon nitride, and/or a high dielectric constant material having a higher dielectric constant than silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

Although the gate insulating layer 130 is shown as a single layer, this is only for convenience of explanation, and the embodiments are not limited thereto. The gate insulating layer 130 may include a plurality of layers. The gate insulating layer 130 includes an interfacial layer disposed between the first active pattern AP1 and the first gate electrode 120, and between the second active pattern AP2 and the first gate electrode 120, and a high dielectric constant insulating layer. For example, the interfacial layer may not be formed along the profile of the upper surface 105US of the field insulating layer.

A semiconductor device according to some embodiments may include an NC (Negative Capacitance) FET that uses a negative capacitor. For example, the gate insulating layer 130 may include a ferroelectric material layer having ferroelectric properties, and a paraelectric material layer having paraelectric properties.

The ferroelectric material layer may have a negative capacitance, and the paraelectric material layer may have a positive capacitance. For example, if two or more capacitors are connected in series and the capacitance of each capacitor has a positive value, the overall capacitances decrease from the capacitance of each of the individual capacitors. On the other hand, if at least one of the capacitances of two or more capacitors connected in series has a negative value, the overall capacitances may be greater than an absolute value of each of the individual capacitances, while having a positive value.

When the ferroelectric material layer having the negative capacitance and the paraelectric material layer having the positive capacitance are connected in series, the overall capacitance values of the ferroelectric material layer and the paraelectric material layer connected in series may increase. By the use of the increased overall capacitance value, a transistor including the ferroelectric material layer may have a subthreshold swing (SS) below 60 mV/decade at room temperature.

The ferroelectric material layer may have ferroelectric properties. The ferroelectric material layer may include, for example, at least one of hafnium oxide, hafnium zirconium oxide, barium strontium titanium oxide, barium titanium oxide, and/or lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and/or oxygen (O).

The ferroelectric material layer may further doped to include a dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The type of dopant included in the ferroelectric material layer may vary, depending on which type of ferroelectric material is included in the ferroelectric material layer.

When the ferroelectric material layer includes hafnium oxide, the dopant included in the ferroelectric material layer may include, for example, at least one of gadolinium (Gd), silicon (Si), zirconium (Zr), aluminum (Al), and/or yttrium (Y).

When the dopant is aluminum (Al), the ferroelectric material layer may include 3 to 8 at % (atomic %) aluminum. Here, a ratio of the dopant may be a ratio of aluminum to the sum of hafnium and aluminum.

When the dopant is silicon (Si), the ferroelectric material layer may include 2 to 10 at % silicon. When the dopant is yttrium (Y), the ferroelectric material layer may include 2 to 10 at % yttrium. When the dopant is gadolinium (Gd), the ferroelectric material layer may include 1 to 7 at % gadolinium. When the dopant is zirconium (Zr), the ferroelectric material layer may include 50 to 80 at % zirconium.

The paraelectric material layer may have paraelectric properties. The paraelectric material layer may include, for example, at least one of a silicon oxide and a metal oxide having a high dielectric constant. The metal oxide included in the paraelectric material layer may include, for example, but is not limited to, at least one of hafnium oxide, zirconium oxide, and/or aluminum oxide.

The ferroelectric material layer and the paraelectric material layer may include the same material. The ferroelectric material layer has ferroelectric properties, but the paraelectric material layer may not have ferroelectric properties. For example, when the ferroelectric material layer and the paraelectric material layer include hafnium oxide, a crystal structure of hafnium oxide included in the ferroelectric material layer is different from a crystal structure of hafnium oxide included in the paraelectric material layer.

The ferroelectric material layer may have a thickness that facilitates the ferroelectric properties. The thickness of the ferroelectric material layer may be, for example, but is not limited to, 0.5 to 10 nm. Since a critical thickness that exhibits the ferroelectric properties may vary for each ferroelectric material, the thickness of the ferroelectric material layer may vary depending on the ferroelectric material.

As an example, the gate insulating layer 130 may include one ferroelectric material layer. As another example, the gate insulating layer 130 may include a plurality of ferroelectric material layers spaced apart from each other. The gate insulating layer 130 may have a stacked layer structure in which the plurality of ferroelectric material layers and the plurality of paraelectric material layers are alternately stacked.

The gate spacer 140 may be disposed on the side wall of the gate electrode 120. The gate spacer 140 may not be disposed between the first lower pattern BP1 and the first sheet pattern NS1, and between the first sheet patterns NS1 adjacent in the third direction D3.

The gate spacer 140 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof. Although the gate spacer 140 is each shown to be a single layer, this example is only for convenience of explanation, and the embodiments are not limited thereto.

A gate capping pattern 145 may be disposed on the gate electrode 120. An upper surface 145US of the gate capping pattern may be disposed on the same plane as an upper surface of the first interlayer insulating layer 190. The gate capping pattern 145 may be disposed between the gate spacers 140, unlike the shown example.

The gate capping pattern 145 may include, for example, at least one of silicon nitride (SiN), silicon oxynitride (SiON), silicon carbonitride (SiCN), silicon oxycarbonitride (SiOCN), and combinations thereof. The gate capping pattern 145 may include a material having an etch selectivity with respect to the first interlayer insulating layer 190.

A first source/drain pattern 150 may be formed on the first active pattern AP1. The first source/drain pattern 150 may be disposed on the first lower pattern BP1.

The first source/drain pattern 150 may be disposed between the gate electrodes 120 adjacent in the first direction X. The first source/drain pattern 150 may contact the first active pattern AP1. The first source/drain pattern 150 may contact the first sheet pattern NS1. The first source/drain pattern 150 is connected to the first sheet pattern NS1 on the upper surface 100US of the substrate. The first source/drain pattern 150 may be connected to the first end NS1_E1 of the first sheet pattern.

A second source/drain pattern 160 may be disposed on the first active pattern AP1. The second source/drain pattern 160 may be disposed on the first lower pattern BP1. The gate electrode 120 is disposed between the first source/drain pattern 150 and the second source/drain pattern 160.

The second source/drain pattern 160 may be disposed between the gate electrodes 120 adjacent in the first direction X. The second source/drain pattern 160 may contact the first active pattern AP1. The second source/drain pattern 160 may contact the first sheet pattern NS1. The second source/drain pattern 160 is connected to the first sheet pattern NS1 on the upper surface 100US of the substrate. The second source/drain pattern 160 may be connected to the second end NS1_E2 of the first sheet pattern.

Although not shown, a source/drain pattern may be disposed on the second lower pattern BP2 between the gate electrodes 120. A source/drain pattern on the second lower pattern BP2 may be connected to the end of the second sheet pattern NS2.

A source/drain pattern connected to a first power source/drain contact 170 to be described below may be the first source/drain pattern 150. A source/drain pattern connected to a first source/drain contact 175 to be described below may be the second source/drain pattern 160.

The first source/drain pattern 150 may include an upper source/drain region 150UR and a lower source/drain region 150LR. The upper source/drain region 150UR is directly connected to the lower source/drain region 150LR. On the basis of the upper surface 100US of the substrate, the upper source/drain region 150UR is located on the lower source/drain region 150LR.

The upper source/drain region 150UR may contact the first sheet pattern NS1. The lower source/drain region 150LR may not contact the first sheet pattern NS1.

The upper source/drain regions 150UR may include an upper inserted epitaxial region 151 and a first upper epitaxial region 152. The upper inserted epitaxial region 151 may come into contact with the first sheet pattern NS1 and the first lower pattern BP1. From the viewpoint of a cross-sectional view, such as FIG. 2, the upper inserted epitaxial region 151 may be separated into two parts by the lower source/drain region 150LR. The upper inserted epitaxial region 151 may have a shape similar to a line extending in the third direction Z.

The first upper epitaxial region 152 is disposed on the upper inserted epitaxial region 151. The first upper epitaxial region 152 contacts the upper inserted epitaxial region 151. The upper inserted epitaxial region 151 is disposed between the first sheet pattern NS1 and the first upper epitaxial region 152.

The upper source/drain region 150UR may include an epitaxial recess 150R_EP. From the viewpoint of a cross-sectional view, such as FIG. 2, the epitaxial recess 150R_EP may be disposed inside the upper inserted epitaxial region 151 and the first upper epitaxial region 152. From the viewpoint of a cross-sectional view such as FIG. 4, the epitaxial recess 150R_EP may be disposed inside the first upper epitaxial region 152. In the course of forming the epitaxial recess 150R_EP, the upper inserted epitaxial region 151 may be removed.

The first upper epitaxial region 152 may include the epitaxial recess 150R_EP. The epitaxial recess 150R_EP is recessed in a direction from the lower surface 100BS of the substrate toward the upper surface 100US of the substrate. On the basis of the lower surface 100BS of the substrate, the bottom surface of the epitaxial recess 150R_EP is higher than the lowest part of the upper source/drain regions 150UR in the Z direction.

The lower source/drain region 150LR may be located in the epitaxial recess 150R_EP. The lower source/drain region 150LR may include a first lower epitaxial region 153.

In FIG. 6, the first lower epitaxial region 153 is located inside the epitaxial recess 150R_EP. The first lower epitaxial region 153 may fill the entire epitaxial recess 150R_EP. The first lower epitaxial region 153 may contact the upper inserted epitaxial region 151 and the first upper epitaxial region 152.

The second source/drain pattern 160 includes a second lower epitaxial region 161 and a second upper epitaxial region 162. The second upper epitaxial region 162 is disposed on the second lower epitaxial region 161.

The second lower epitaxial region 161 may contact the first sheet pattern NS1 and the first lower pattern BP1. From the viewpoint of a cross-sectional view such as FIG. 2, the second lower epitaxial region 161 may have a "U" shape.

Although an external shape of the first source/drain pattern 150 and an external shape of the second source/drain pattern 160 are shown to be similar to a hexagon in FIG. 4, the embodiments are not limited thereto. Unlike the shown example, the external shape of the first source/drain pattern 150 and the external shape of the second source/drain pattern 160 may be a shape similar to a pentagon or a square.

The upper inserted epitaxial region 151, the first upper epitaxial region 152, the first lower epitaxial region 153, the second lower epitaxial region 161, and the second upper epitaxial region 162 may include, for example, silicon or germanium, which is an elemental semiconductor material. Moreover, the upper inserted epitaxial region 151, the first upper epitaxial region 152, the first lower epitaxial region 153, the second lower epitaxial region 161, and the second upper epitaxial region 162 may include, for example, a binary compound or a ternary compound including at least two or more of carbon (C), silicon (Si), germanium (Ge) and/or tin (Sn), or a compound obtained by doping these elements with a group IV element. The upper inserted epitaxial region 151, the first upper epitaxial region 152, the first lower epitaxial region 153, the second lower epitaxial region 161, and the second upper epitaxial region 162 may each include an epitaxial layer made of a semiconductor.

The upper inserted epitaxial region 151 and the second lower epitaxial region 161 are formed in the same manufacturing process. The upper inserted epitaxial region 151 and the second lower epitaxial region 161 are formed of the same material. If the upper inserted epitaxial region 151 and the second lower epitaxial region 161 are a compound, such as silicon-germanium, a fraction of germanium of the upper inserted epitaxial region 151 is identical to a fraction of germanium of the second lower epitaxial region 161.

The first upper epitaxial region 152 and the second upper epitaxial region 162 are formed in the same manufacturing process. The first upper epitaxial region 152 and the second upper epitaxial region 162 are formed of the same material.

For example, the upper inserted epitaxial region 151, the first upper epitaxial region 152, the first lower epitaxial region 153, the second lower epitaxial region 161, and the second upper epitaxial regions 162 may include, but are not limited to, silicon, silicon-germanium, silicon carbide, or the like.

The first source/drain pattern 150 and the second source/drain pattern 160 may include dopants doped into the semiconductor material. The first source/drain pattern 150 and the second source/drain pattern 160 include dopants of the same conductivity type.

As an example, the first source/drain pattern 150 and the second source/drain pattern 160 include, for example, a p-type dopant. The p-type dopant may include, but is not limited to, at least one of boron (B) and/or gallium (Ga).

As another example, the first source/drain pattern 150 and the second source/drain pattern 160 include, for example, an n-type dopant. The n-type dopant may include, but is not limited to, at least one of phosphorus (P), arsenic (As), antimony (Sb), and/or bismuth (Bi).

A concentration (/cm$^3$ or at. % (atomic percent)) of dopant included in the upper inserted epitaxial region 151 is less than the concentration of dopant included in the first upper epitaxial region 152. The concentration of dopant included in the upper inserted epitaxial region 151 is less than the concentration of dopant included in the first lower epitaxial region 153. The concentration of dopant included in the second lower epitaxial region 161 is less than the concentration of dopant included in the second upper epitaxial region 162.

Because the upper inserted epitaxial region 151 and the second lower epitaxial region 161 are formed in the same manufacturing process, the concentration of dopant included in the upper inserted epitaxial region 151 may be the same as the concentration of dopant included in the second lower epitaxial region 161. Because the first upper epitaxial region 152 and the second upper epitaxial region 162 are formed in the same manufacturing process, the concentration of dopant included in the first upper epitaxial region 152 may be the same as the concentration of dopant included in the second upper epitaxial region 162.

Although the upper inserted epitaxial region 151, the first upper epitaxial region 152, and the first lower epitaxial region 153 may be distinguished by the material included in the epitaxial layer, composition, concentration of dopant, and the like, the embodiments are not limited thereto. The first upper epitaxial region 152 and the first lower epitaxial region 153 may have the same material, the same composition, and the same dopant concentration. Depending on the growth conditions and environment of the first lower epitaxial region 153, a boundary between the first upper epitaxial region 152 and the first lower epitaxial region 153 may not be distinguished.

A height from the lower surface 100BS of the substrate to the lowest part of the first source/drain pattern 150 may be a first height H11. A height from the lower surface 100BS of the substrate to the lowest part of the second source/drain pattern 160 may be a second height H12. Here, the lowest part of the first source/drain pattern 150 may be a portion of the first source/drain pattern 150 closest to the lower surface 100BS of the substrate.

As an example, the first height H11 is greater than the second height H12. As another example, the first height H11 is the same as the second height H12. In yet another example, the first height H11 is less than the second height H12. If a part of the first lower epitaxial region 153 fills substantially the entire epitaxial recess 150R_EP, the lowest part of the first lower epitaxial region 153 may be lower than the lowest part of the second lower epitaxial region 162 in the Z direction on the basis of the lower surface 100BS of the substrate.

A source/drain etching stop layer 185 may extend along the outer wall of the gate spacer 140, the profile of the first source/drain pattern 150, and the profile of the second source/drain pattern 160. The source/drain etching stop layer 185 may be disposed on the upper surface 105US of the field insulating layer.

The source/drain etching stop layer 185 may include a material having an etch selectivity with respect to a first interlayer insulating layer 190, which will be described below. The source/drain etching stop layer 185 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof.

A first interlayer insulating layer 190 is disposed on the upper surface 100US of the substrate. The first interlayer insulating layer 190 may be disposed on the first source/drain pattern 150 and the second source/drain pattern 160. The first interlayer insulating layer 190 may not cover the upper surface of the gate capping pattern 145 in the Z direction. For example, the upper surface of the first interlayer insulating layer 190 may be located on the same plane as the upper surface 145US of the gate capping pattern.

The first interlayer insulating layer 190 may include, for example, at least one of silicon oxide, silicon nitride, silicon oxynitride, and/or a low dielectric constant material. The low dielectric constant material may include, for example, but is not limited to, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

The first power source/drain contact 170 may extend lengthwise in the third direction Z. The first power source/drain contact 170 may be connected to the first source/drain pattern 150. For example, the first power source/drain contact 170 is electrically connected to the first source/drain pattern 150.

The first power source/drain contact 170 may pass through the first lower pattern BP1 and the substrate 100. The first power source/drain contact 170 extends from the lower surface 100BS of the substrate to the first source/drain pattern 150. A part of the first power source/drain contact 170 is disposed inside the substrate 100.

A depth from the upper surface AP1_US of the first active pattern to the lower surface 170BS of the first power source/drain contact may be identical to a depth from the upper surface AP1_US of the first active pattern to the lower surface 100BS of the substrate. The first power source/drain contact 170 may include side walls 170SW extending from the lower surface 100BS of the substrate in the third direction Z.

The first source/drain contact 175 may extend lengthwise in the third direction Z. The first source/drain contact 175 may be connected to the second source/drain pattern 160. For example, the first source/drain contact 175 is electrically connected to the second source/drain pattern 160.

The first source/drain contact 175 is disposed on the upper surface 100US of the substrate. The first source/drain contact 175 does not penetrate the substrate 100. A height from the upper surface AP1_US of the first active pattern to the upper surface 175US of the first source/drain contact may be identical to a height from the upper surface AP1_US of the first active pattern to the upper surface 145US of the gate capping pattern.

A shape in which the second power source/drain contact 270 and the second source/drain contact 275 are electrically connected to the source/drain pattern on the second lower pattern BP2 may be similar to that of FIG. 2.

A first contact silicide layer 155 may be disposed between the first power source/drain contact 170 and the first source/drain pattern 150. The first contact silicide layer 155 may be connected to the lower source/drain region 150LR. The first contact silicide layer 155 contacts the first lower epitaxial region 153.

A second contact silicide layer 165 may be disposed between the first source/drain contact 175 and the second source/drain pattern 160. The second contact silicide layer 165 contacts the second upper epitaxial region 162.

For example, the first power source/drain contact 170 may have a single layer structure. The first power source/drain contact 170 may not be a multi-layer structure including different materials from each other. The first power source/drain contact 170 may be monolithically formed of one conductive material. The first power source/drain contact 170 may have a single conductive layer structure. At this time, the first power source/drain contact 170 may include impurities that are introduced unintentionally in the course of forming the first power source/drain contact 170.

As an example, the first power source/drain contact 170 may be formed of a single grain. As another example, the first power source/drain contact 170 may include a plurality of grains divided by a grain boundary. The first power source/drain contact 170 may include a metal capable of being selectively grown on the conductive material. The first power source/drain contact 170 may include, for example, but is not limited to, one of titanium (Ti), tungsten (W), molybdenum (Mo), ruthenium (Ru), and/or cobalt (Co).

The second power source/drain contact 270 is formed in the same manufacturing process as the first power source/drain contact 170.

Although the first source/drain contact 175 is shown as having a single conductive layer structure, the embodiments are not limited thereto. Unlike the shown example, the first source/drain contact 175 may have multiple conductive layer structures including a contact barrier layer and a contact plug layer, as in the first power source/drain contact 170 shown through FIGS. 21 to 25. The first source/drain contact 175 may include, for example, at least one of a metal, a metal alloy, a conductive metal nitride, a conductive metal carbide, a conductive metal oxide, a conductive metal carbonitride, and/or a two-dimensional material (2D material).

The first contact silicide layer 151 and the second contact silicide layer 156 may include a metal silicide material.

Because the first contact silicide layer 155 is in contact with the first lower epitaxial region 153, which has a higher concentration of dopant than the upper inserted epitaxial region 151, a resistance between the first power source/drain contact 170 and the first source/drain pattern 150 can be reduced. Therefore, the performance and reliability of the semiconductor device can be improved.

The first power line 50 and the second power line 60 may be disposed on the lower surface 100BS of the substrate. For example, although the first power line 50 and the second power line 60 may each extend in the first direction X, the embodiments are not limited thereto.

The first power line 50 may be spaced apart from the second power line 60 in the second direction Y. The first power line 50 and the second power line 60 may be alternately disposed on the lower surface 100BS of the substrate.

The first power line 50 may be connected to the first power source/drain contact 170. The first power source/drain contact 170 connects the first power line 50 and the first source/drain pattern 150.

Although not shown, the second power line 60 may be connected to the second power source/drain contact 270. Voltage applied to the first power line 50 may be different from the voltage applied to the second power line 60.

The first source/drain contact 175 is not connected to the first power line 50. Although not shown, the second source/drain contact 275 may not be connected to the second power line 60.

The first power line 50 and the second power line 60 may include, for example, at least one of a metal, a metal alloy, a conductive metal nitride, a conductive metal carbide, a conductive metal oxide, a conductive metal carbonitride, and/or a two-dimensional material (2D material).

The second interlayer insulating layer 191 may be disposed on the first interlayer insulating layer 190, the gate structure GS, and the first source/drain contact 175. The second interlayer insulating layer 191 may include, for example, at least one of silicon oxide, silicon nitride, silicon carbonitride, silicon oxynitride, and/or a low dielectric constant material.

The wiring structure 195 may be disposed in the second interlayer insulating layer 191. The wiring structure 195 is disposed on the upper surface 100US of the substrate. The wiring structure 195 may include a via plug 196 and a wiring line 197.

The wiring structure 195 may be connected to the first source/drain contact 175. The first source/drain contact 175 may connect the wiring structure 195 and the second source/drain pattern 160. The wiring structure 195 may not be connected to the first power source/drain contact 170.

Unlike the shown example, the wiring structure 195 may be connected to the first power source/drain contact 170 and the first source/drain contact 175.

The via plug 196 and the wiring line 197 may each include, for example, at least one of a metal, a metal alloy, a conductive metal nitride, a conductive metal carbide, a conductive metal oxide, a conductive metal carbonitride, and a two-dimensional material.

Although the via plug 196 and the wiring line 197 are each shown as being a single conductive layer structure, this is only for convenience of explanation, and the embodiments are not limited thereto. As an example, at least one of the via plug 196 and the wiring line 197 may have multiple conductive layer structures, unlike the shown example. As another example, the wiring structure 195 may have an integral or monolithic structure in which no boundary is distinguished between the via plug 196 and the wiring line 197.

Figure 7:
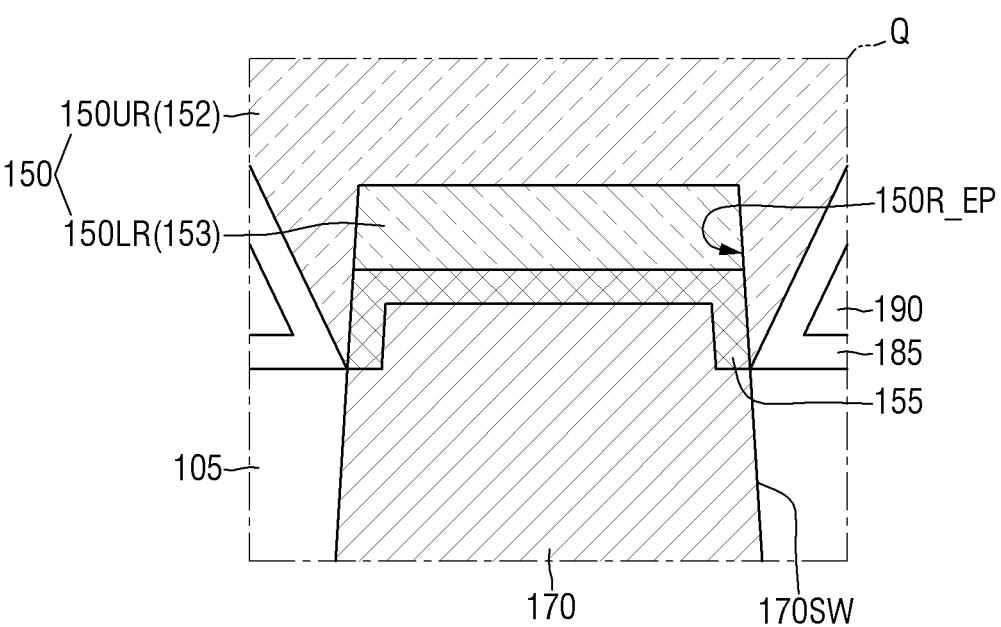
FIGS. 7 and 8 are diagrams that illustrate a semiconductor device according to some embodiments, respectively.
Figure 8:
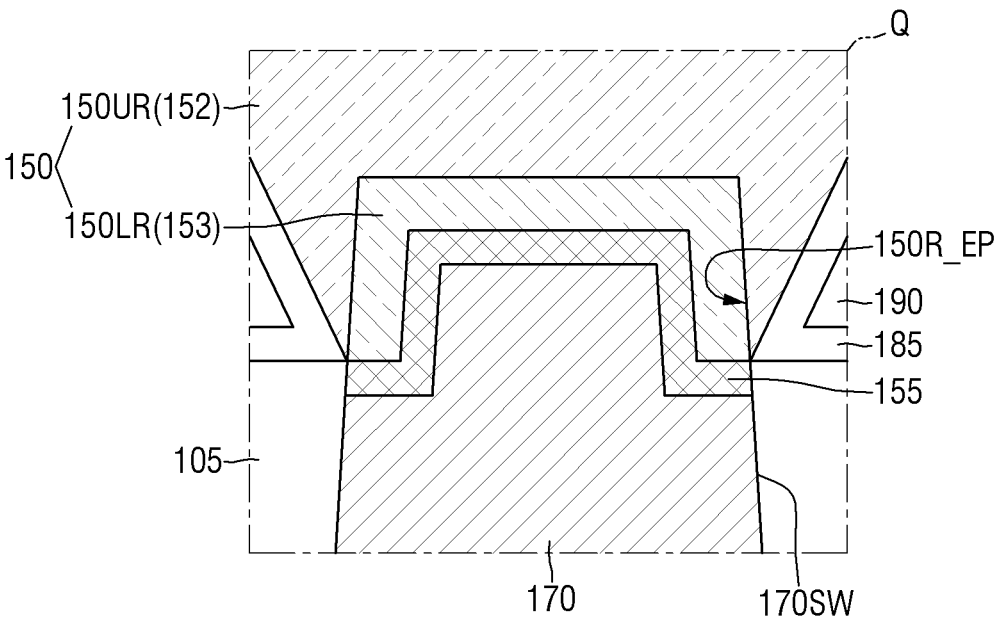

FIGS. 7 and 8 are diagrams that illustrate a semiconductor device according to some embodiments, respectively. For convenience of explanation, the description will focus on features that are different from those explained using FIGS. 1 to 6.

For reference, FIGS. 7 and 8 are enlarged views of a portion Q of FIG. 4, respectively.

Referring to FIG. 7, in the semiconductor device according to some embodiments, the first lower epitaxial region 153 may be in and fill a part of the epitaxial recess 150R_EP.

The first lower epitaxial region 153 is formed along the bottom surface of the epitaxial recess 150R_EP, but may not be formed along the side walls of the epitaxial recess 150R_EP.

A first contact silicide layer 155 may be disposed in the epitaxial recess 150R_EP. The first contact silicide layer 155 may include a horizontal portion formed along the first lower epitaxial region 153, and a vertical portion formed along the first upper epitaxial region 152. A part of the first power source/drain contact 170 may be disposed inside the epitaxial recess 150R_EP.

Referring to FIG. 8, in the semiconductor device according to some embodiments, a first lower epitaxial region 153 may be formed along side walls and a bottom surface of the epitaxial recess 150R_EP.

The first contact silicide layer 155 may be formed along the profile of the first lower epitaxial region 153. A part of the first power source/drain contact 170 may be disposed inside the epitaxial recess 150R_EP.

FIGS. 9 to 14 are diagrams that illustrate a semiconductor device according to some embodiments. For convenience of explanation, the description will focus on points that are different from those explained using FIGS. 1 to 6.

Figure 9:
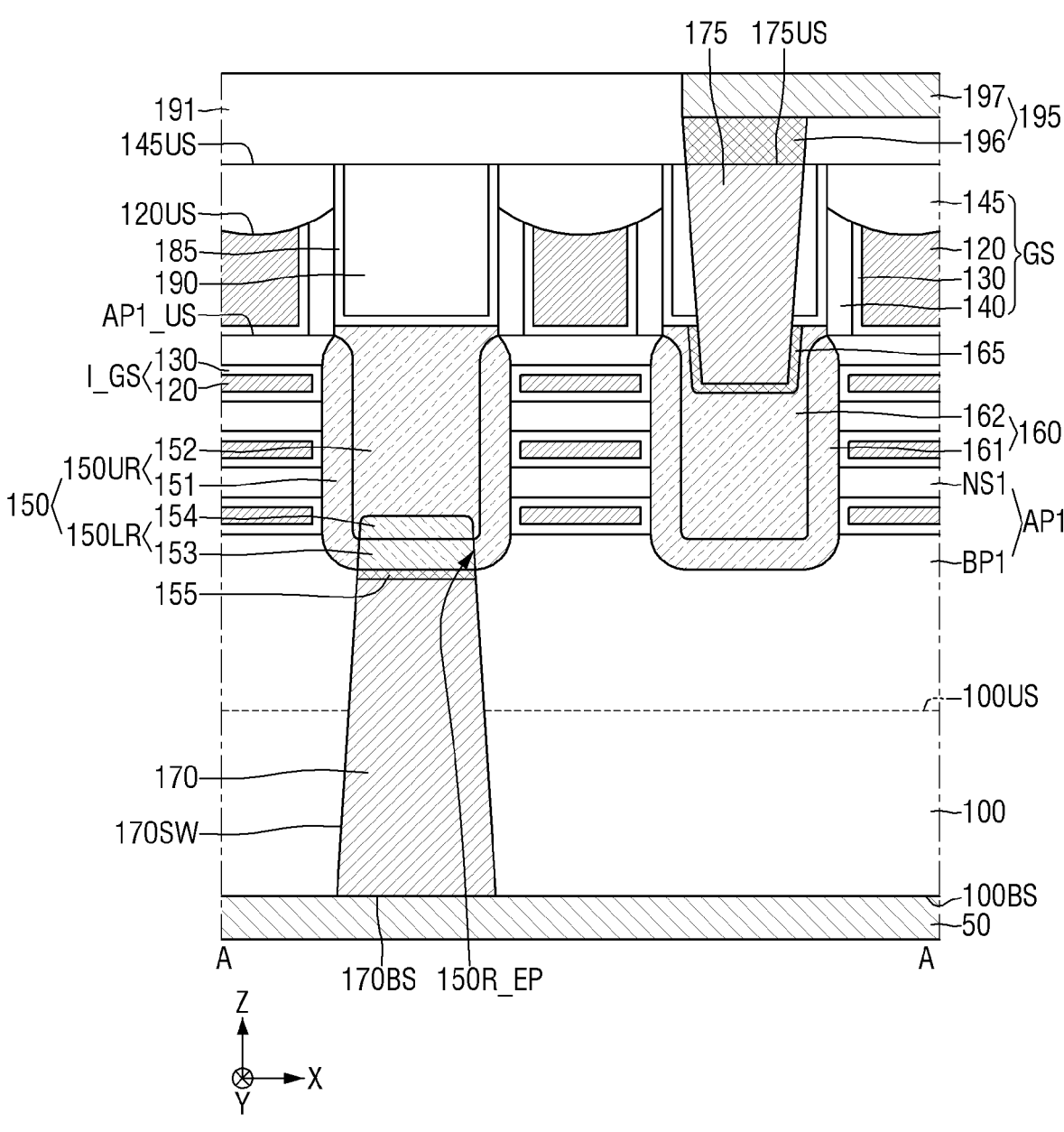
FIGS. 9 to 14 are diagrams that illustrate a semiconductor device according to some embodiments.
Figure 10:
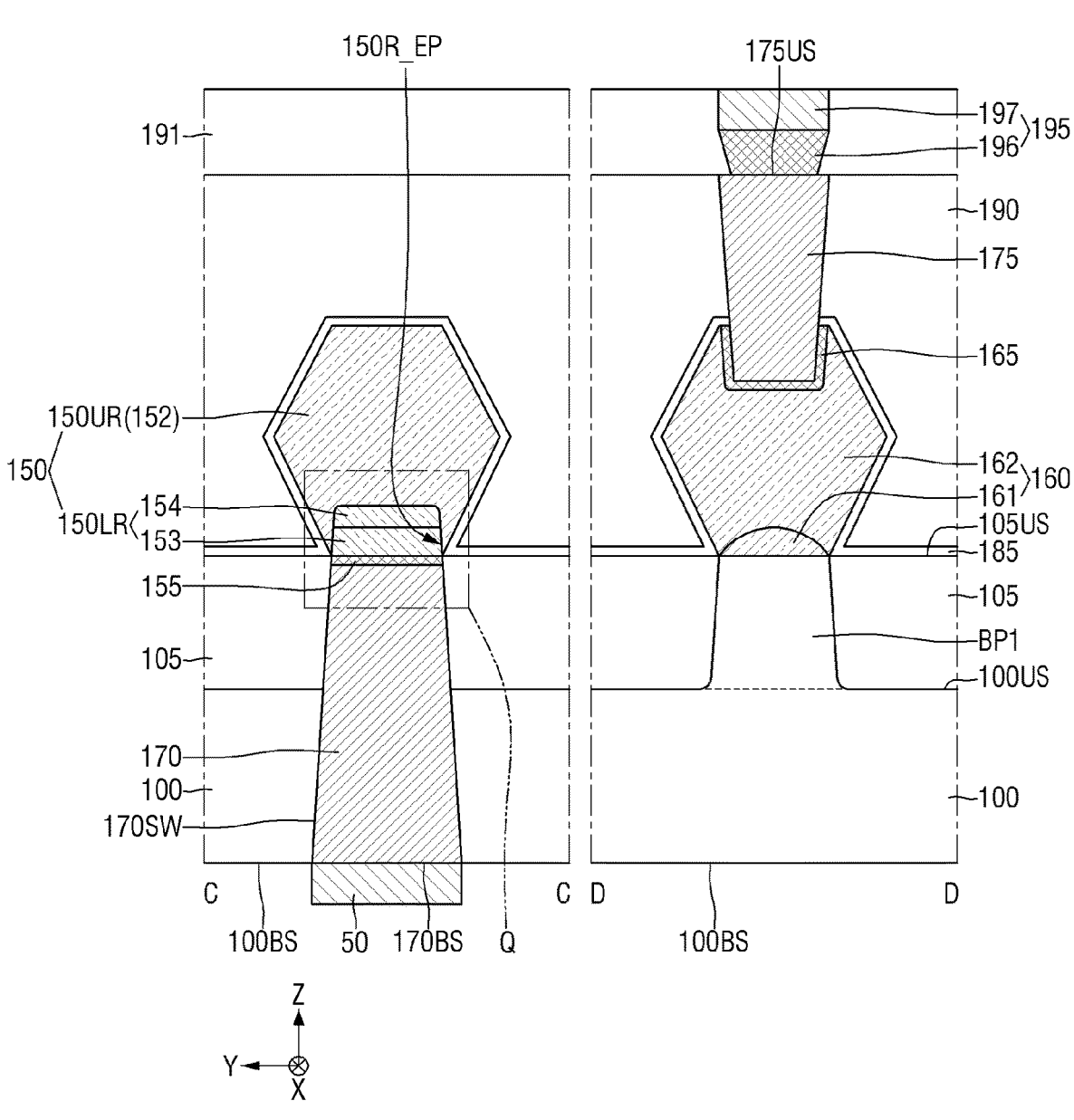

For reference, FIGS. 9 and 10 are cross-sectional views taken along lines A-A and B-B of FIG. 1. FIGS. 11 to 14 are enlarged views of a portion Q of FIG. 10.

Referring to FIGS. 9 to 14, in the semiconductor device according to some embodiments, the first source/drain pattern 150 may further include a lower inserted epitaxial region 154 located between the first upper epitaxial region 152 and the first lower epitaxial region 153.

The lower source/drain region 150LR may include a lower inserted epitaxial region 154 and a first lower epitaxial region 153. The lower inserted epitaxial region 154 and the first lower epitaxial region 153 may be disposed inside the epitaxial recess 150R_EP. The lower inserted epitaxial region 154 may contact the first upper epitaxial region 152 and the first lower epitaxial region 153.

The lower inserted epitaxial region 154 may include, for example, silicon or germanium which is an elemental semiconductor material. The lower inserted epitaxial region 154 may include, for example, a binary compound or a ternary compound including at least two or more of carbon (C), silicon (Si), germanium (Ge) and/or tin (Sn), or a compound obtained by doping these elements with a group IV element. The lower inserted epitaxial region 154 may include an epitaxial layer made of a semiconductor.

The lower inserted epitaxial region 154 includes dopants of the same conductivity type as that of the first lower epitaxial region 153. The concentration of dopant included in the lower inserted epitaxial region 154 is lower than the concentration of dopant included in the first upper epitaxial region 152. The concentration of dopant included in the lower inserted epitaxial region 154 is lower than the concentration of dopant included in the first lower epitaxial region 153.

Figure 11:
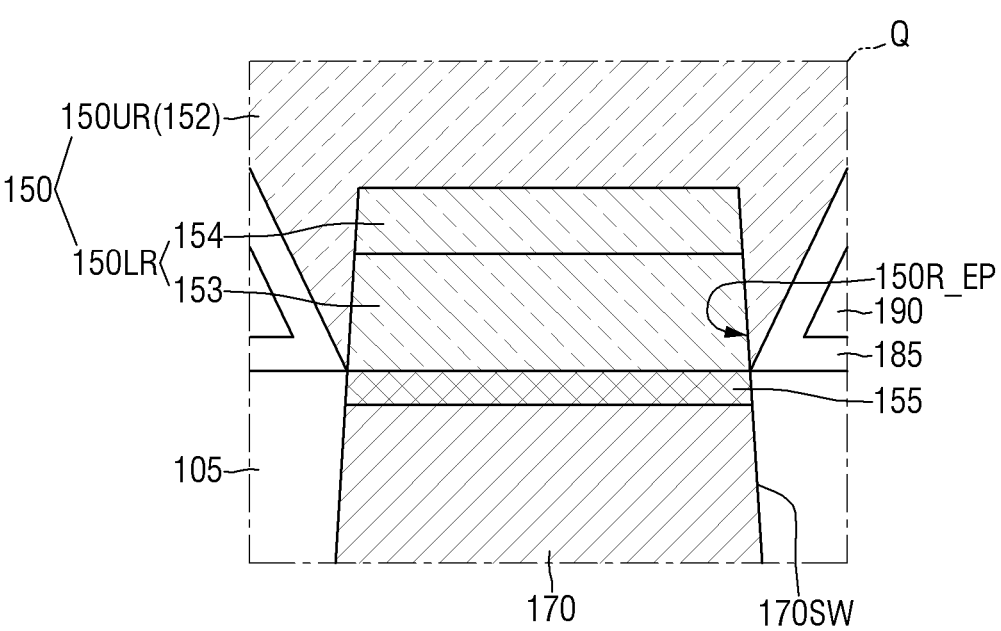
Figure 12:
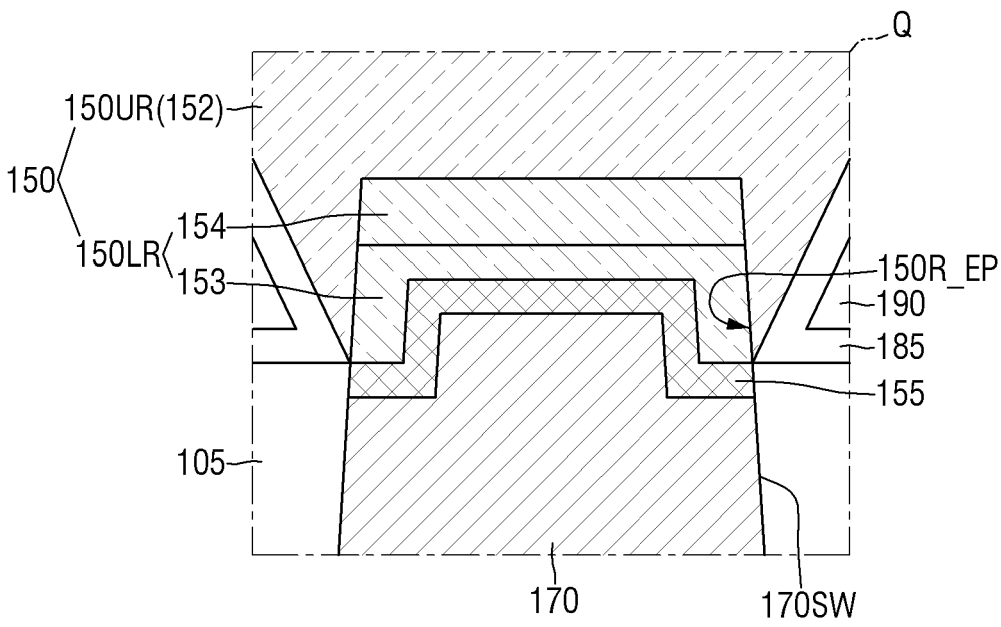

In FIGS. 11 and 12, the lower inserted epitaxial region 154 is formed along the bottom surface of the epitaxial recess 150R_EP, but may not be formed along the side walls of the epitaxial recess 150R_EP.

In FIG. 11, the first lower epitaxial region 153 may be in and substantially fill the remainder of the epitaxial recess 150R_EP. The first lower epitaxial region 153 may not include a vertical portion extending in the third direction Z. The first contact silicide layer 155 may contact the first lower epitaxial region 153, and may not contact the lower inserted epitaxial region 154.

In FIG. 12, the first lower epitaxial region 153 may include a horizontal portion formed along the lower inserted epitaxial region 154, and a vertical portion formed along the first upper epitaxial region 152. The first contact silicide layer 155 may be formed along the profile of the first lower epitaxial region 153. A part of the first power source/drain contact 170 may be disposed inside the epitaxial recess 150R_EP.

Figure 13:
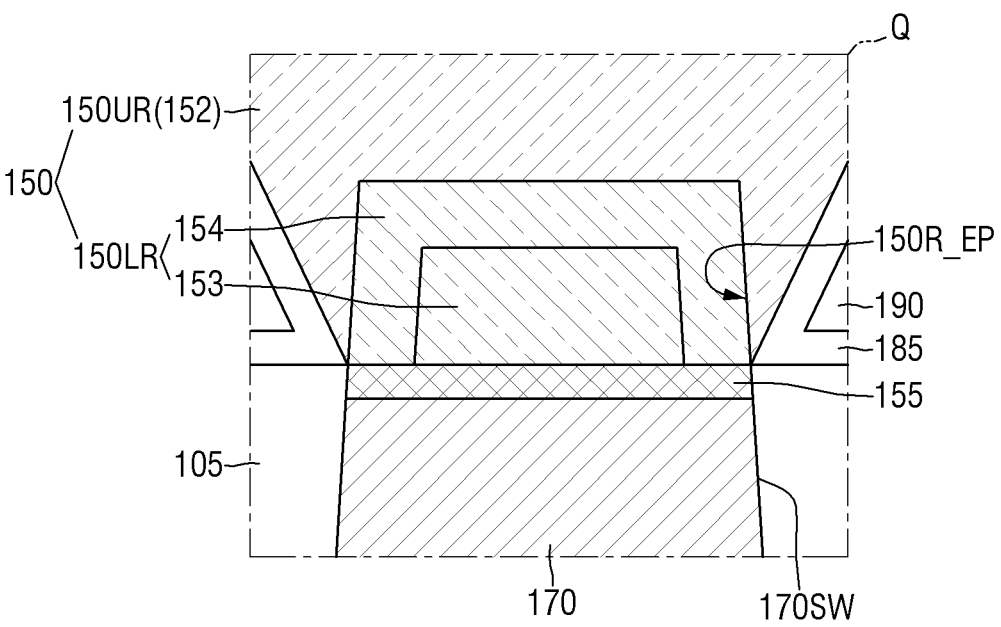
Figure 14:
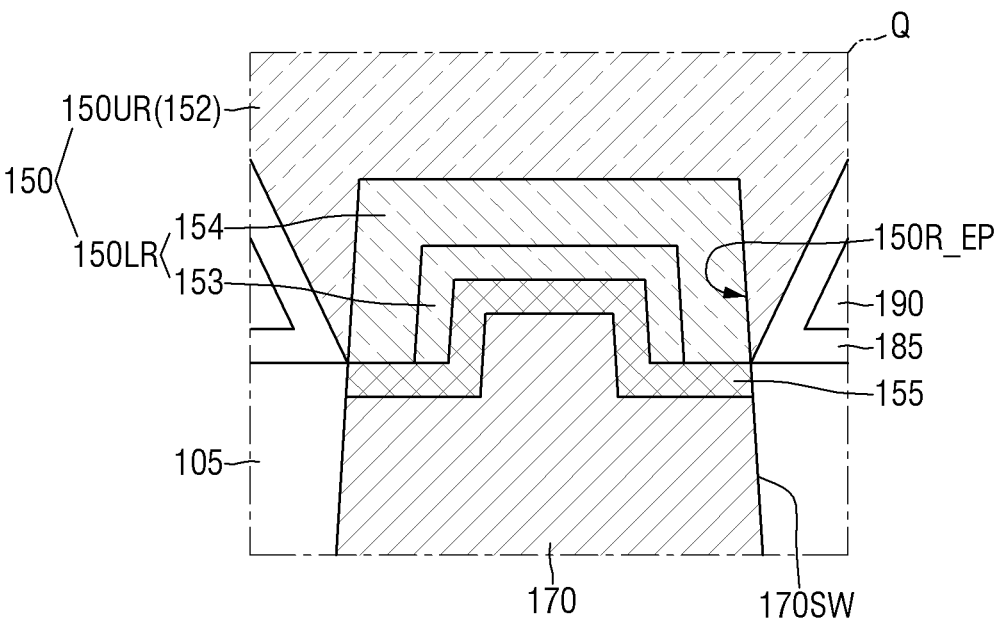

In FIGS. 13 and 14, the lower inserted epitaxial region 154 may include a horizontal portion formed along the bottom surface of the epitaxial recess 150R_EP, and a vertical portion formed along side walls of the epitaxial recess 150R_EP.

In FIG. 13, the first lower epitaxial region 153 may be in and substantially fill the remainder of the epitaxial recess 150R_EP. The first lower epitaxial region 153 may not contact the first upper epitaxial region 152. The first contact silicide layer 155 may contact the first lower epitaxial region 153 and the lower inserted epitaxial region 154.

In FIG. 14, the first lower epitaxial region 153 may be on and at least partially cover the lowest surface of the epitaxial recess 150R_EP in the Z direction. For example, from a viewpoint of a cross-sectional view, the first lower epitaxial region 153 may have a "T" shape rotated by 180 degrees. The first contact silicide layer 155 contacts the first lower epitaxial region 153 and with the lower inserted epitaxial region 154.

In FIG. 14, the first lower epitaxial region 153 may include a horizontal portion formed along the bottom surface of the epitaxial recess 150R_EP, and a vertical portion formed along side walls of the epitaxial recess 150R_EP. The first contact silicide layer 155 may be formed along the profile of the first lower epitaxial region 153.

Unlike that shown in FIG. 14, the first lower epitaxial region 153 may cover the lowest surface of the lower inserted epitaxial region 154. The first contact silicide layer 155 may not make contact with the lower inserted epitaxial region 154.

Figure 15:
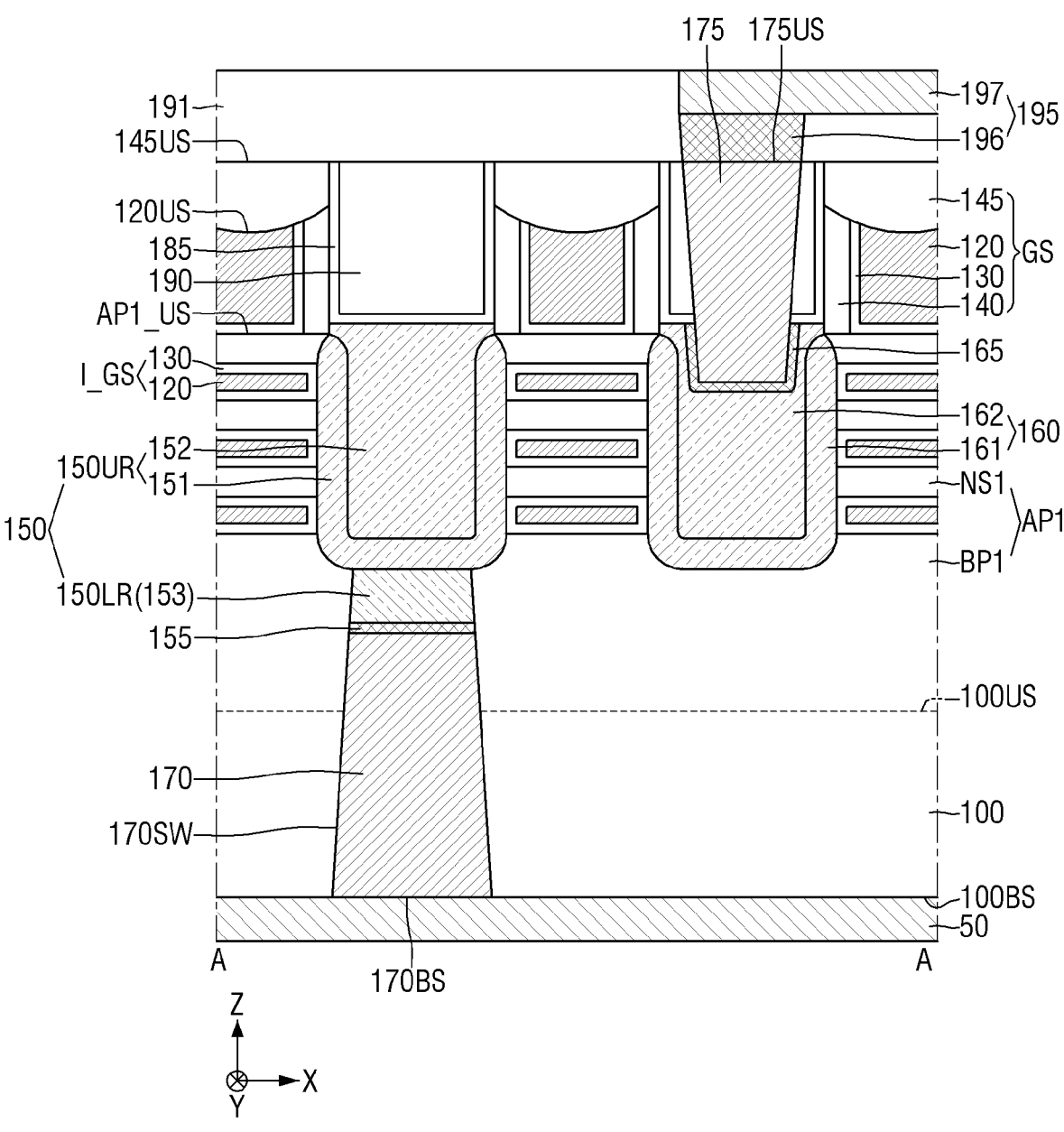
FIGS. 15 and 16 are diagrams that illustrate a semiconductor device according to some embodiments.
Figure 16:
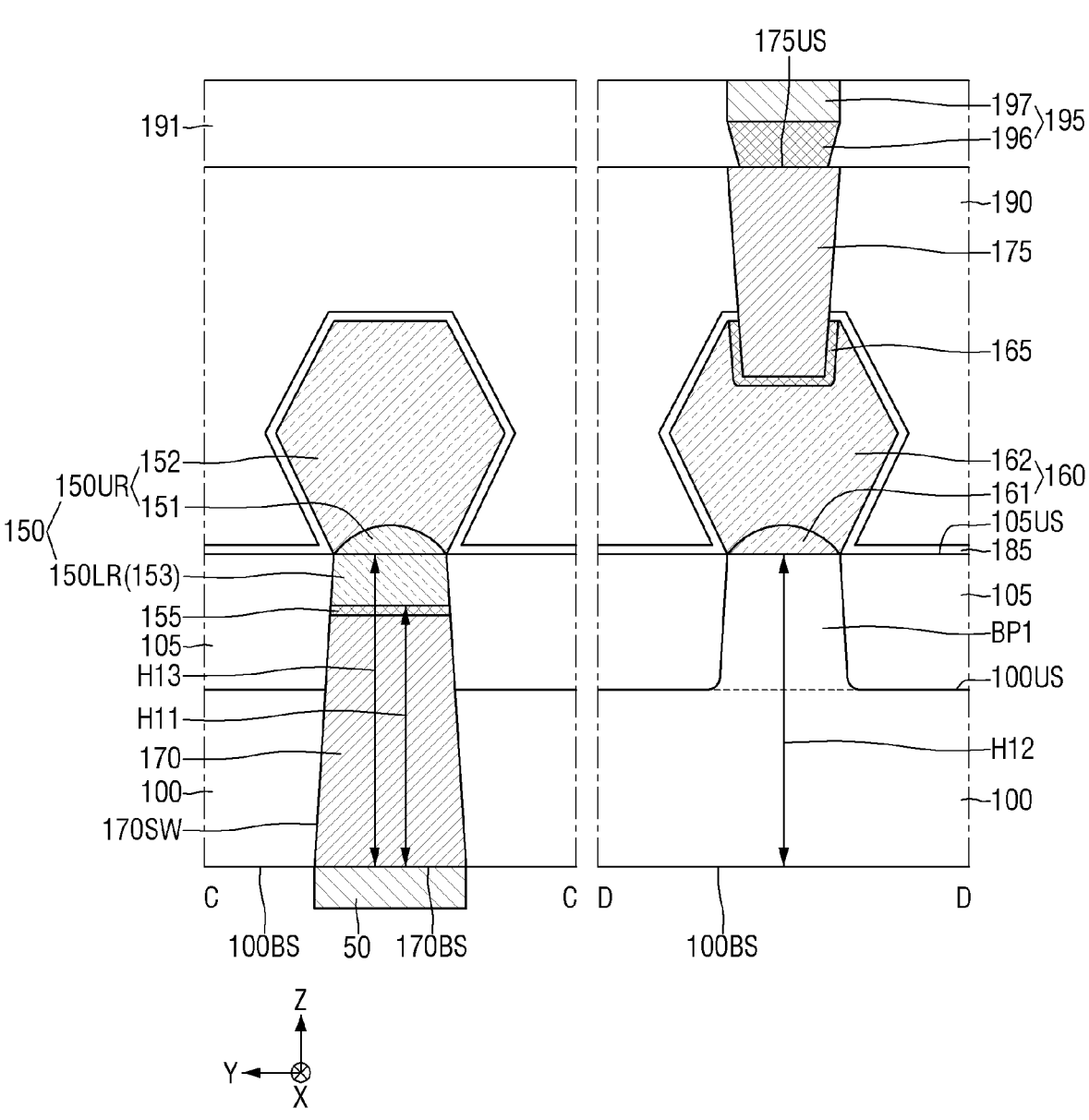

FIGS. 15 and 16 are diagrams that illustrate a semiconductor device according to some embodiments. For convenience of explanation, the description will focus on features that are different from those explained using FIGS. 1 to 6.

Referring to FIGS. 15 and 16, in a semiconductor device according to some embodiments, the upper source/drain region 150UR does not include the epitaxial recess 150R_EP.

From the viewpoint of a cross-sectional view, such as FIG. 15, the upper inserted epitaxial region 151 may have the same "U" shape as the second lower epitaxial region 161.

The lowest part of the first lower epitaxial region 153 may be closer to the lower surface 100BS of the substrate than the upper surface 105US of the field insulating layer.

A height H11 from the lower surface 100BS of the substrate to the lowest part of the first source/drain pattern 150 is less than a height H12 from the lower surface 100BS of the substrate to the lowest part of the second source/drain pattern 160. A height H13 from the lower surface 100BS of the substrate to the lowest part of the upper inserted epitaxial region 151 may be identical to the height H12 from the lower surface 100BS of the substrate to the lowest part of the second source/drain pattern 160.

Figure 17:
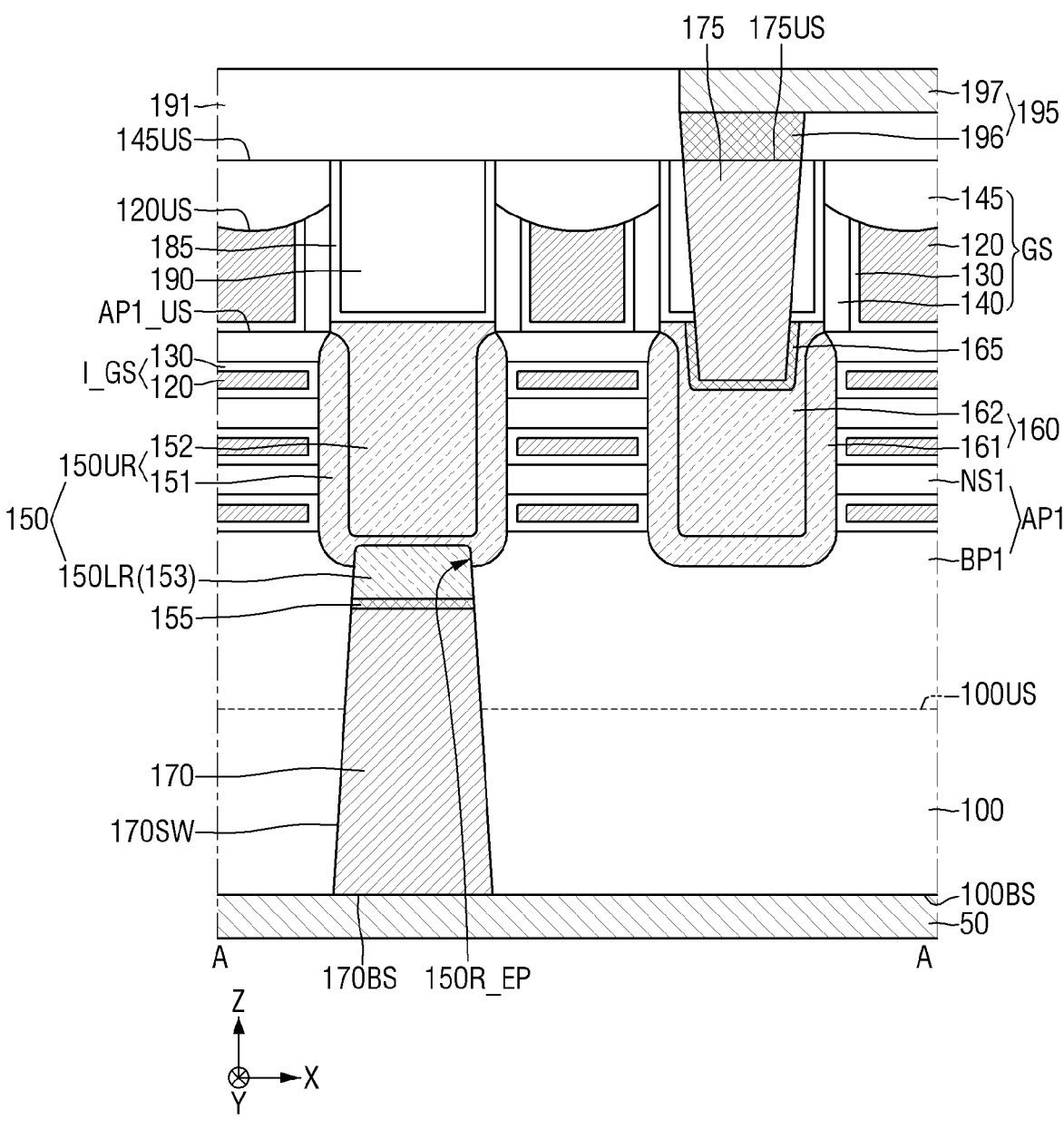
FIGS. 17 and 18 are diagrams that illustrate a semiconductor device according to some embodiments.
Figure 18:
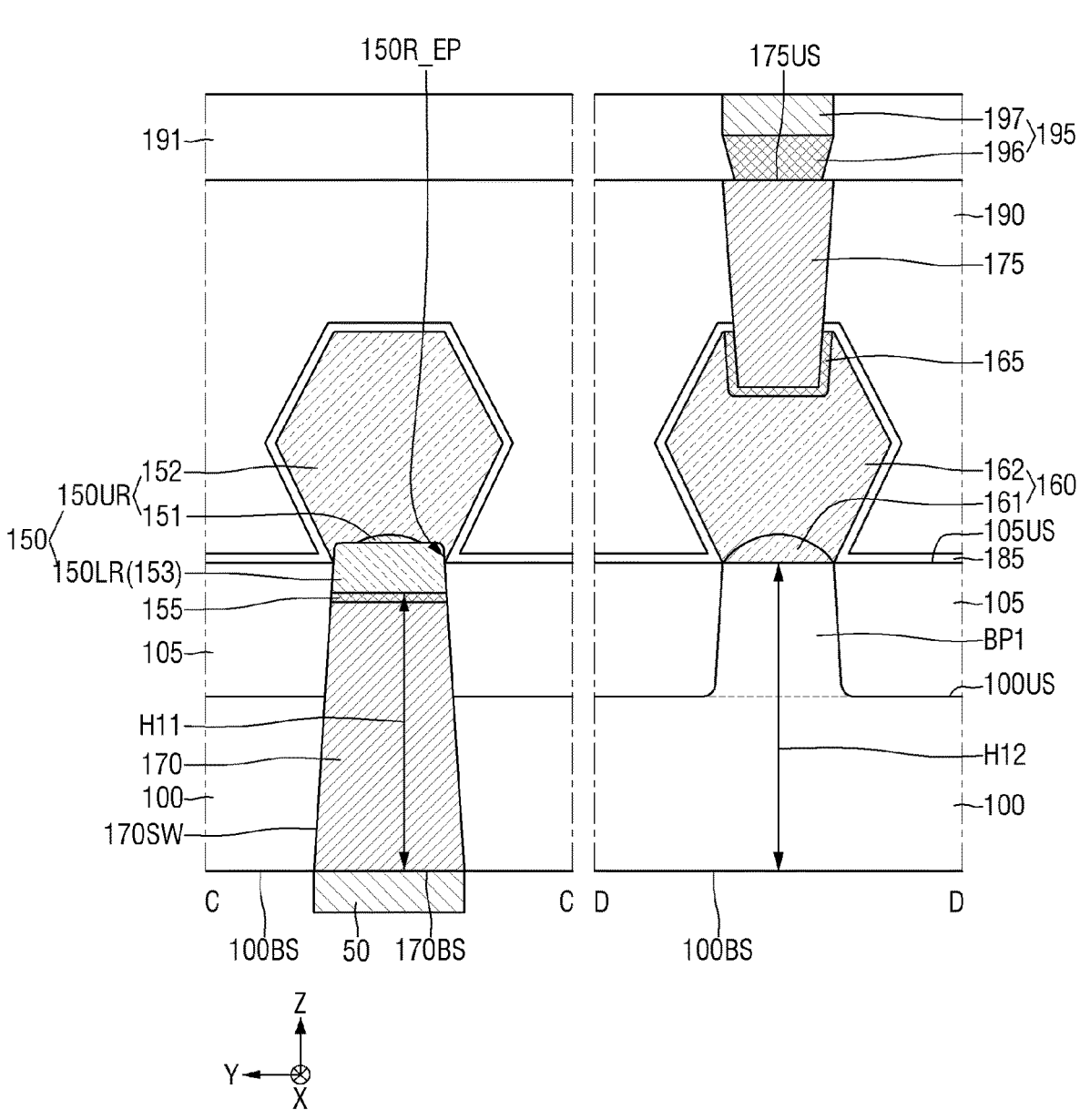

FIGS. 17 and 18 are diagrams that illustrate a semiconductor device according to some embodiments. For convenience of explanation, the description will focus on points that are different from those explained using FIGS. 1 to 6.

Referring to FIGS. 17 and 18, in a semiconductor device according to some embodiments, an epitaxial recess 150R_EP may not extend to the first upper epitaxial region 152 from the viewpoint of a cross-sectional view such as that of FIG. 2.

The epitaxial recess 150R_EP may be disposed in the upper inserted epitaxial region 151.

A part of the first lower epitaxial region 153 may be disposed inside the epitaxial recess 150R_EP. The remainder of the first lower epitaxial region 153 may protrude toward the lower surface 100BS of the substrate beyond the lowest part of the upper inserted epitaxial region 151.

Unlike the shown example, the entire first lower epitaxial region 153 may be disposed inside the epitaxial recess 150R_EP.

Figure 19:
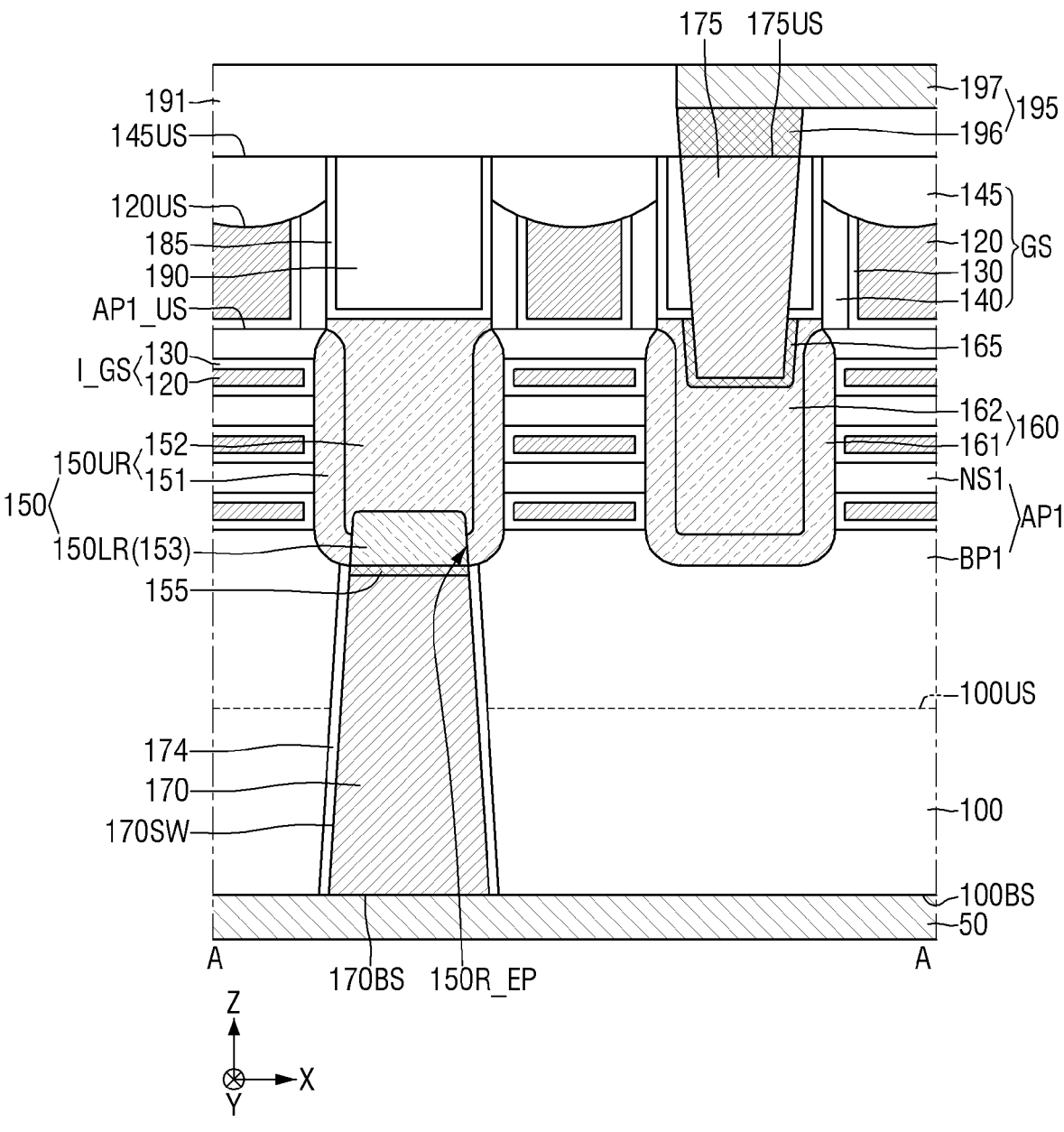
FIGS. 19 and 20 are diagrams that illustrate a semiconductor device according to some embodiments.
Figure 20:
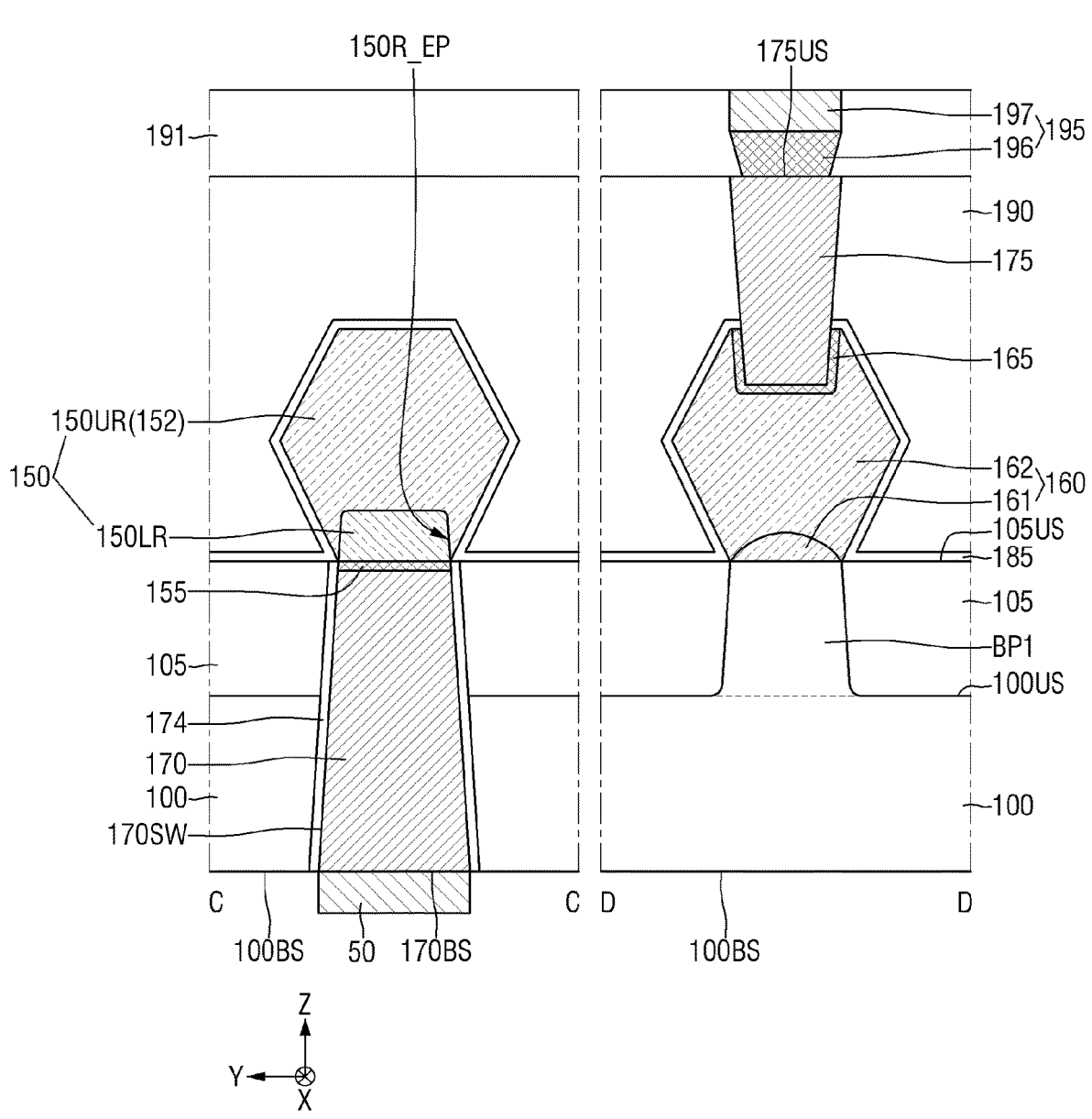

FIGS. 19 and 20 are diagrams that illustrate a semiconductor device according to some embodiments. For convenience of explanation, the description will focus on points that are different from those explained using FIGS. 1 to 6.

Referring to FIGS. 19 and 20, a semiconductor device according to some embodiments may further include a contact insulating liner 174 disposed between the first power source/drain contact 170 and the substrate 100.

The contact insulating liner 174 may extend along side walls 170SW of the first power source/drain contact.

The contact insulating liner 174 may be include an insulating material. The contact insulating liner 174 may include, for example, but is not limited to, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and/or a low dielectric constant material.

FIGS. 21 to 25 are diagrams that illustrate a semiconductor device according to some embodiments. For convenience of explanation, the description will focus on features that are different from those explained using FIGS. 1 to 6.

Figure 21:
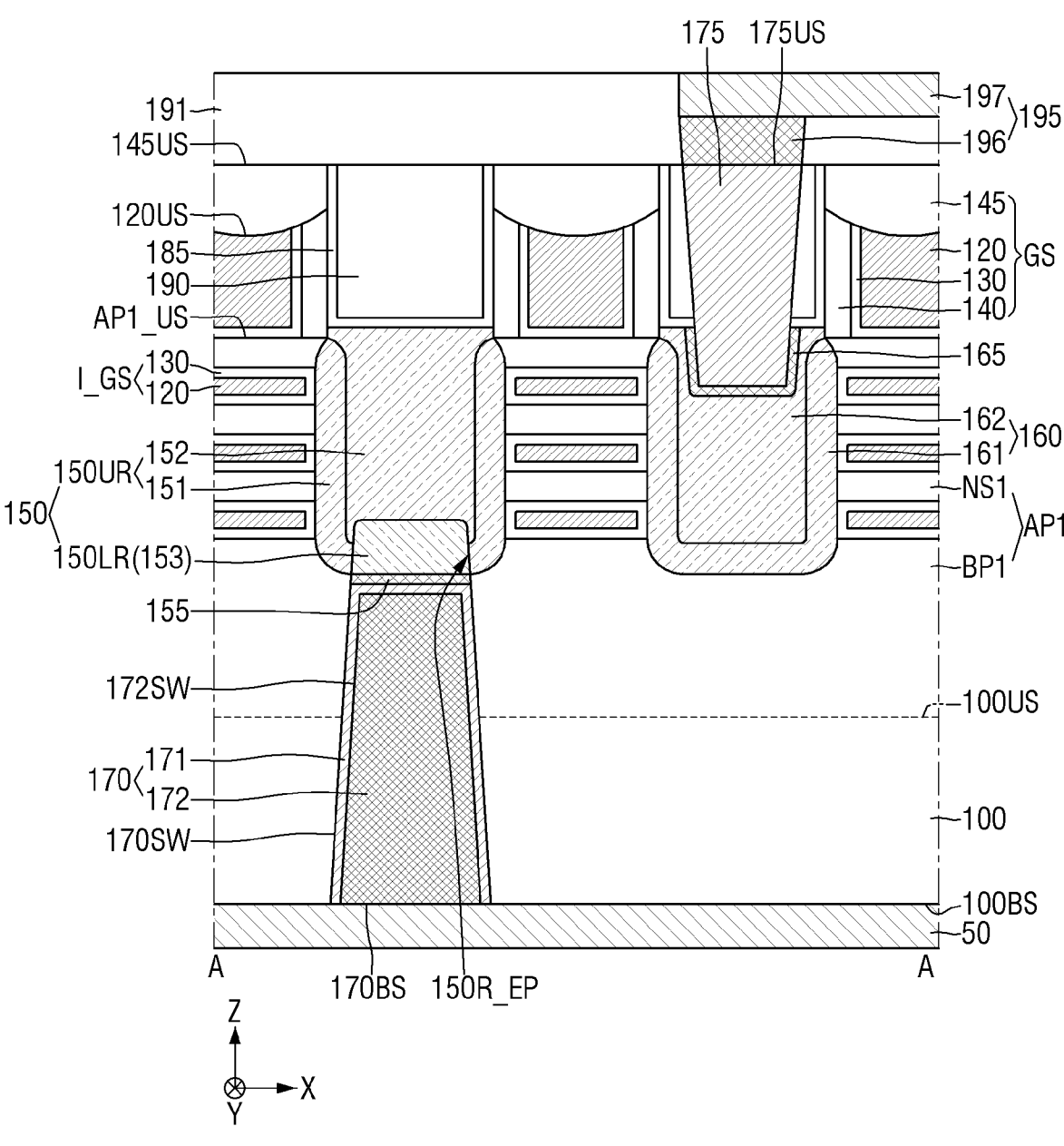
FIGS. 21 to 25 are diagrams that illustrate a semiconductor device according to some embodiments.
Figure 22:
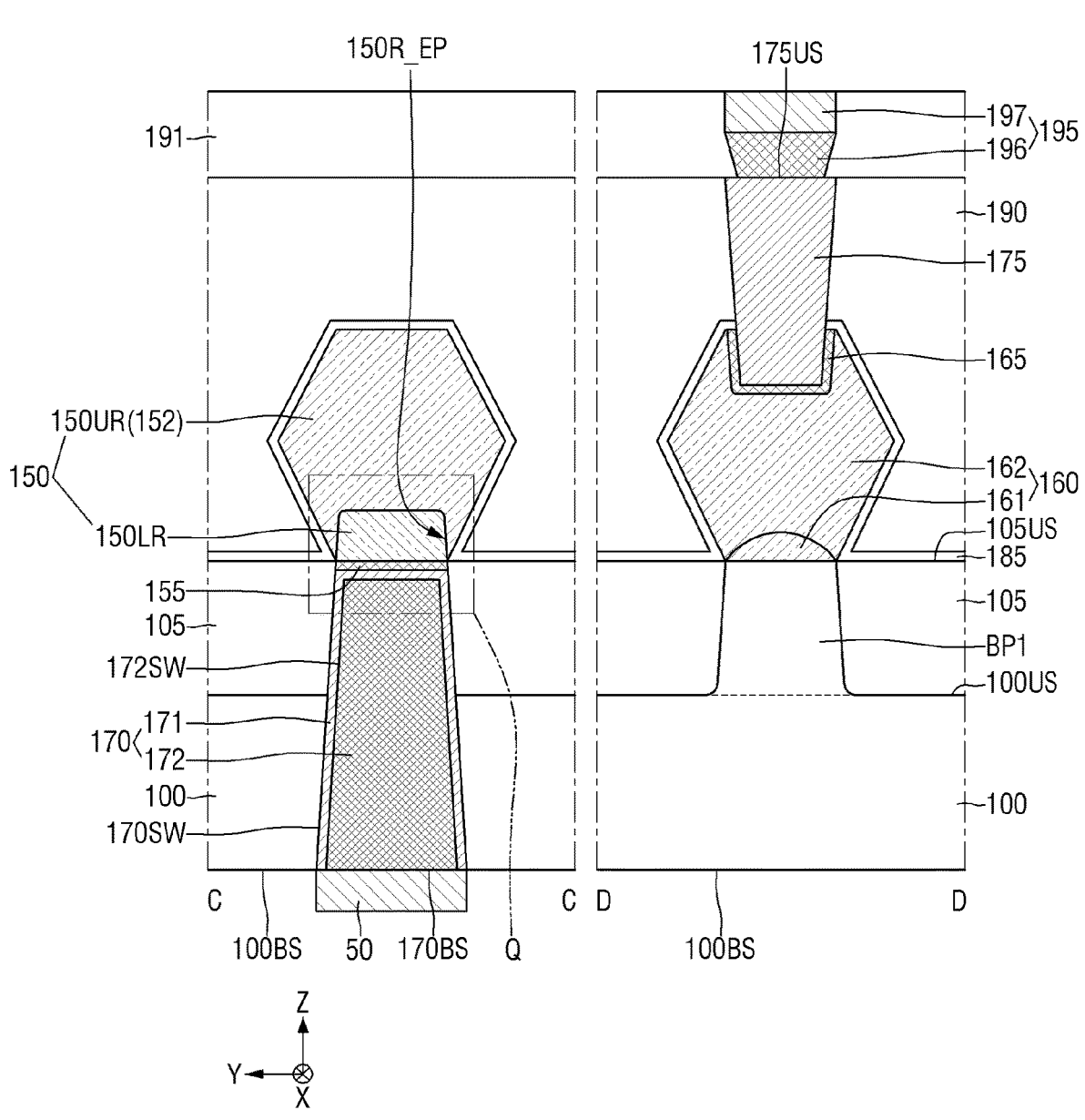
Figure 23:
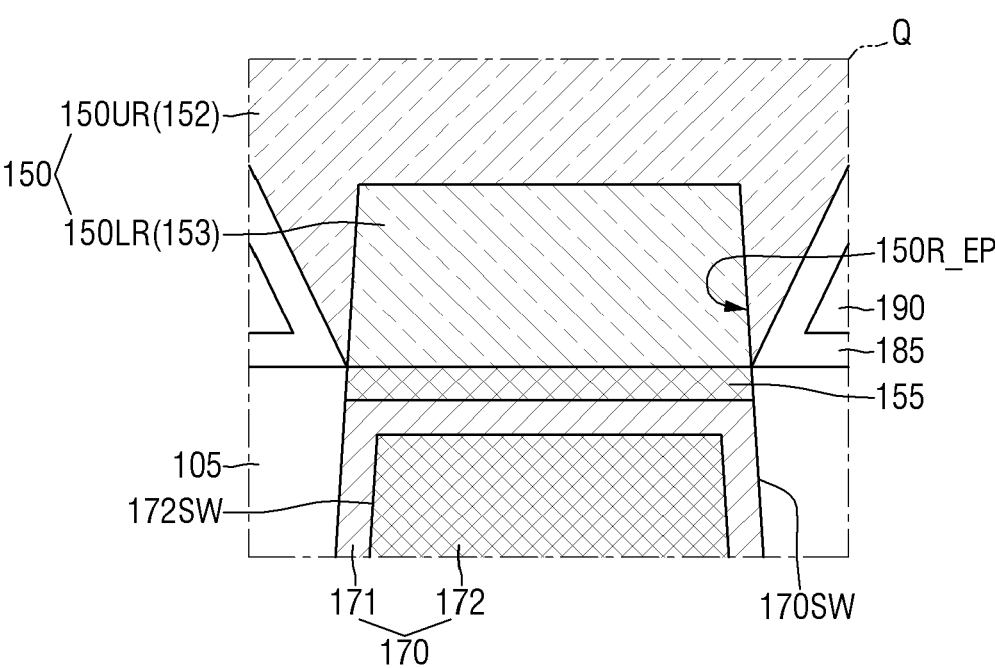
Figure 24:
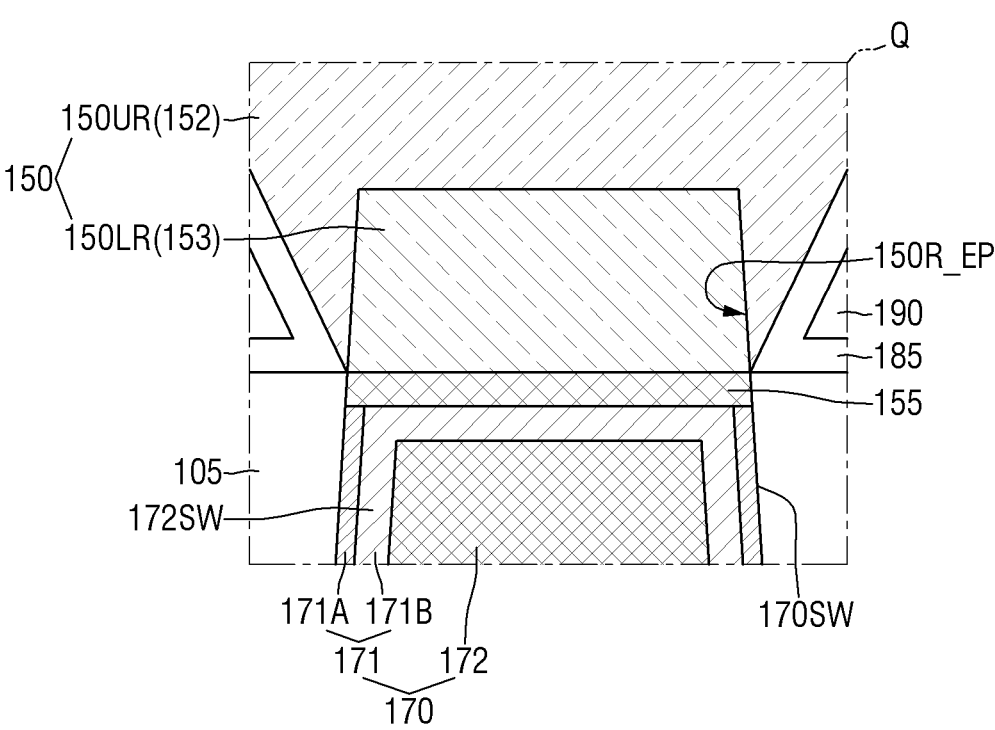
Figure 25:
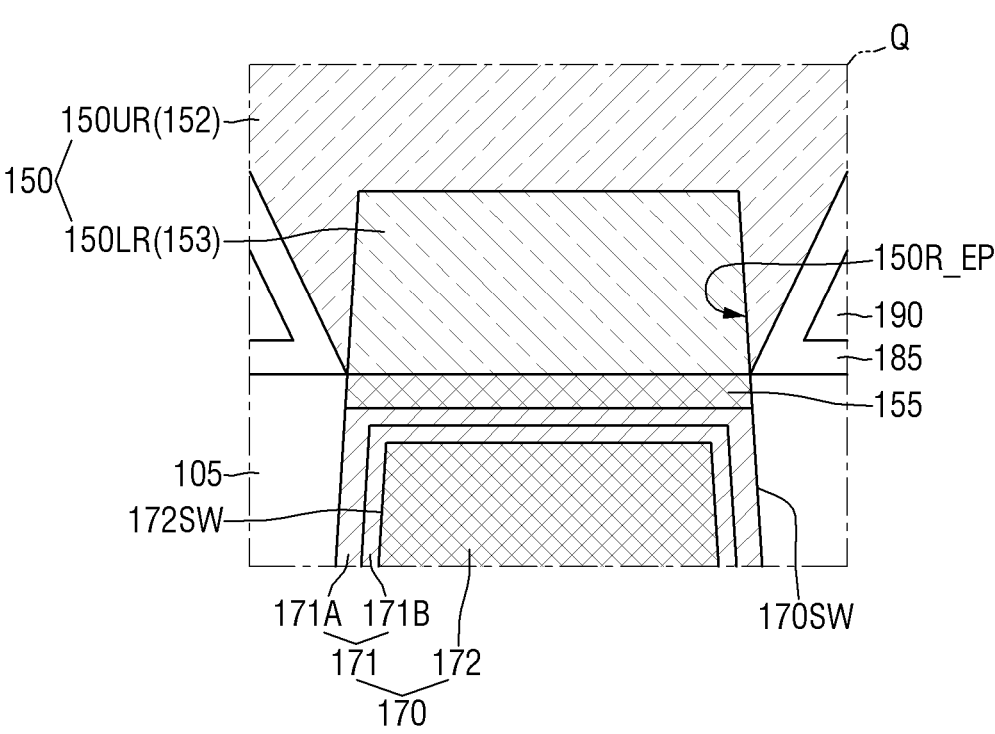

For reference, FIGS. 21 and 22 are cross-sectional views taken along lines A-A and B-B of FIG. 1. FIGS. 23 to 25 are enlarged views of a portion Q of FIG. 22.

Referring to FIGS. 21 to 25, in the semiconductor device according to some embodiments, a first power source/drain contact 170 may include a contact barrier layer 171 and a contact plug layer 172.

The first power source/drain contact 170 may have a multiple conductive layer structure. The contact barrier layer 171 is disposed between the contact plug layer 172 and the first contact silicide layer 155. The contact barrier layer 171 is disposed on the side wall 172SW of the contact plug layer. The contact barrier layer 171 includes side walls 170SW of the first power source/drain contact.

The contact barrier layer 171 and the contact plug layer 172 may each include, for example, at least one of a metal, a metal alloy, a conductive metal nitride, a conductive metal carbide, a conductive metal oxide, a conductive metal carbonitride, and/or a two-dimensional material (2D material).

In FIG. 23, the contact barrier layer 171 may be made up of a single, monolithic layer.

In FIGS. 24 and 25, the contact barrier layer 171 may include a first sub-barrier layer 171A and a second sub-barrier layer 171B. The second sub-barrier layer 171B may be disposed between the first sub-barrier layer 171A and the contact plug layer 172.

The first sub-barrier layer 171A may extend along the side wall 172SW of the contact plug layer. For example, the metal included in the first contact silicide layer 155 may be the same as the metal included in the first sub-barrier layer 171A.

In FIG. 24, the first sub-barrier layer 171A is not disposed between the contact plug layer 172 and the first contact silicide layer 155.

In FIG. 25, the first sub-barrier layer 171A is disposed between the contact plug layer 172 and the first contact silicide layer 155. For example, a thickness of the first sub-barrier layer 171A extending along the side wall 172SW of the contact plug layer may be greater than a thickness of the first sub-barrier layer 171A between the contact plug layer 172 and the first contact silicide layer 155.

Figure 26:
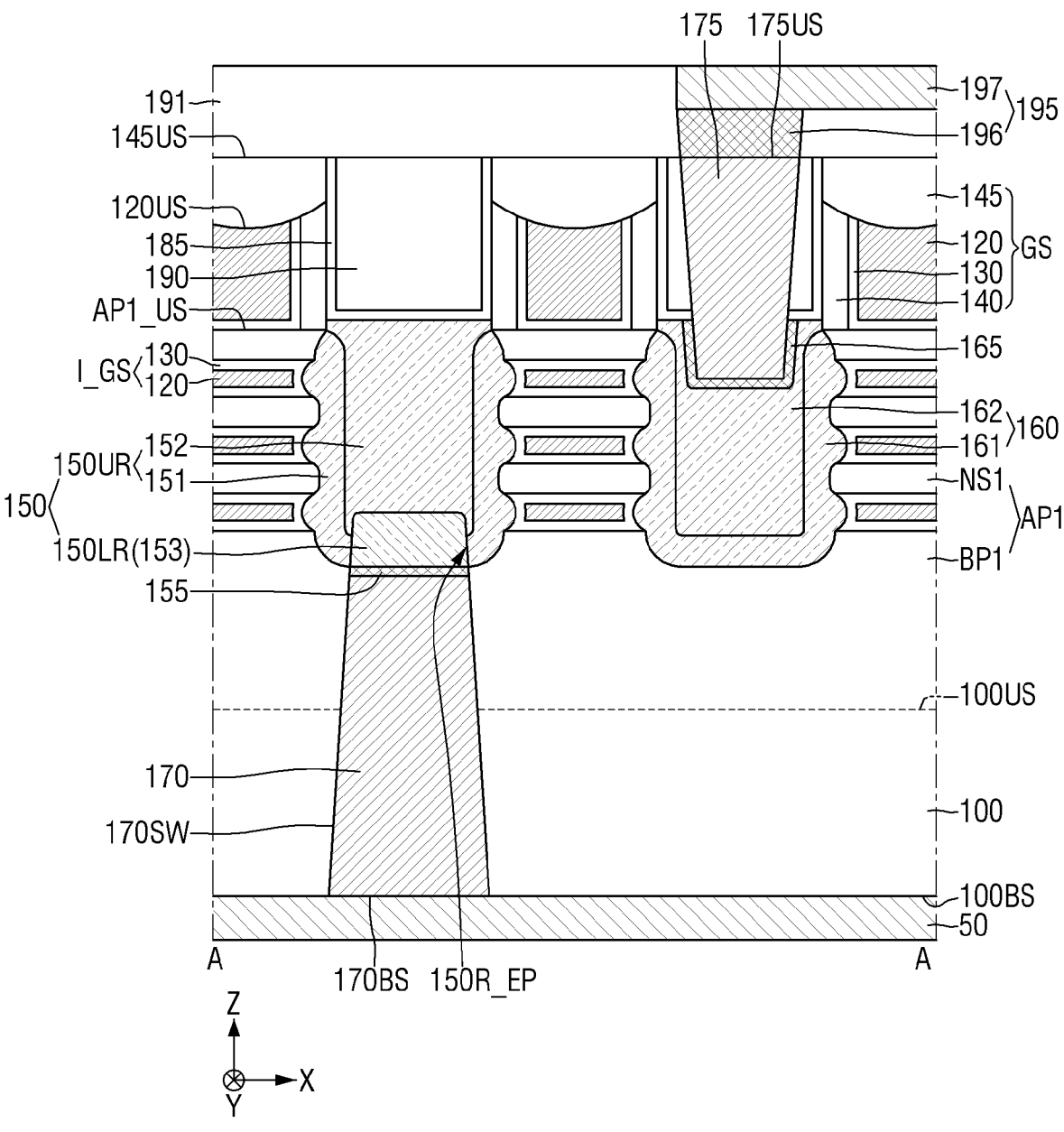
FIGS. 26 and 27 are diagrams that illustrate a semiconductor device according to some embodiments, respectively.
Figure 27:
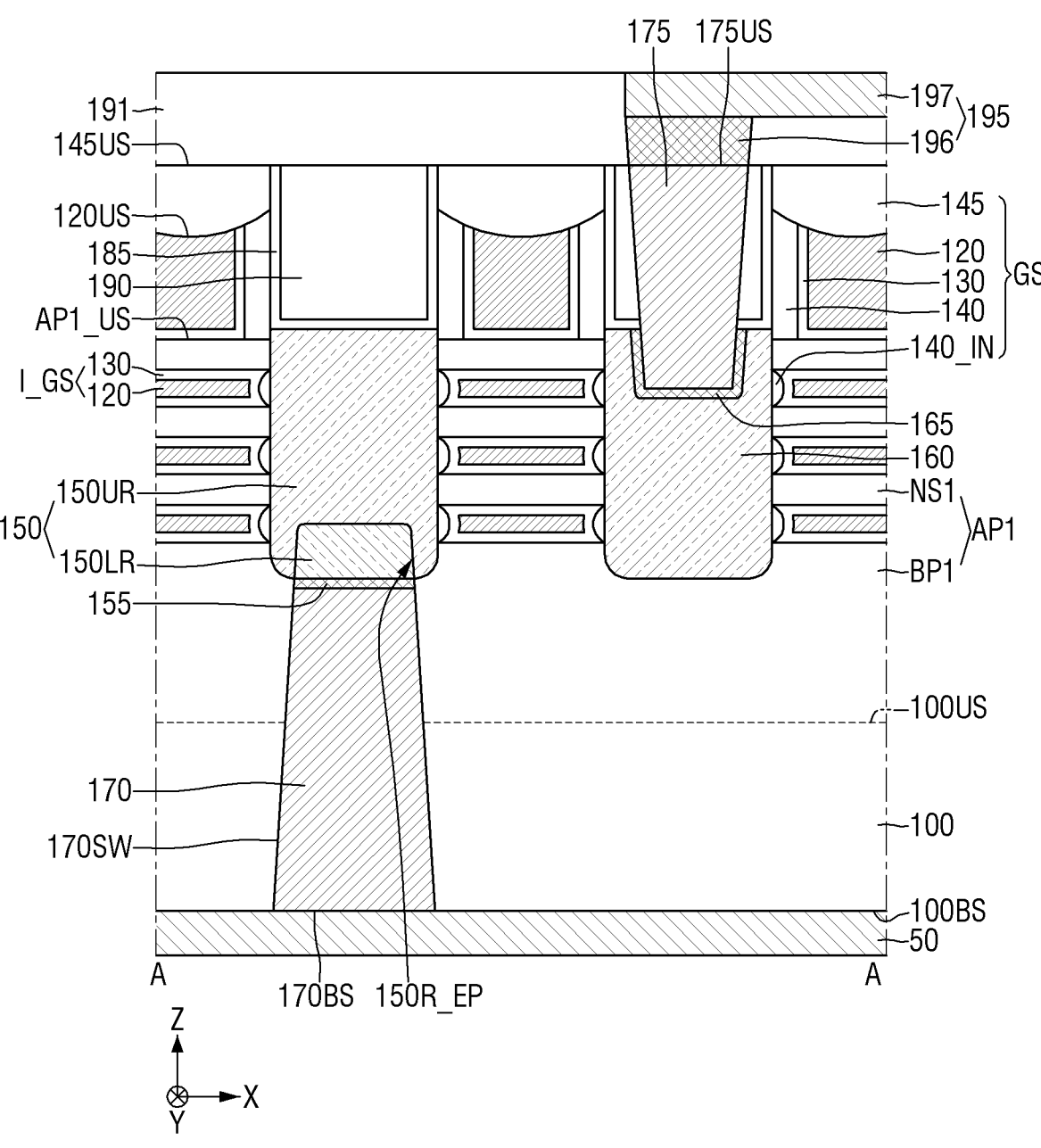

FIGS. 26 and 27 are diagrams that illustrate a semiconductor device according to some embodiments, respectively. For convenience of explanation, the description will focus on features that are different from those described using FIGS. 1 to 6.

Referring to FIG. 26, in the semiconductor device according to some embodiments, the first source/drain pattern 150 and the second source/drain pattern 160 may include outer side walls that abut on the first sheet pattern NS1 and the inner gate structure I_GS1.

The outer side walls of the first source/drain pattern 150 and the outer side walls of the second source/drain pattern 160 may have a wavy shape.

Referring to FIG. 27, in the semiconductor device according to some embodiments, the gate structure GS may further include a plurality of inner spacers 140_IN.

The inner spacers 140_IN may be disposed between the first sheet patterns NS1 adjacent in the third direction Z, and between the first lower pattern BP1 and the first sheet pattern NS1. The inner spacer 140_IN is disposed between the inner gate structure I_GS and the first source/drain pattern 150. The inner spacer 140_IN is disposed between the inner gate structure I_GS and the second source/drain pattern 160.

The inner gate structure I_GS may not contact the first source/drain pattern 150. The inner gate structure I_GS may not contact the second source/drain pattern 160.

For example, the first source/drain pattern 150 and the second source/drain pattern 160 may include n-type dopants. The first source/drain pattern 150 and the second source/drain pattern 160 may not include the upper inserted epitaxial region (151 of FIG. 2) and the second lower epitaxial region (161 of FIG. 2), respectively.

Unlike the shown example, the first source/drain pattern 150 and the second source/drain pattern 160 may each include an upper inserted epitaxial region and a second lower epitaxial region. Although the upper inserted epitaxial region and the second lower epitaxial region may be disposed in the portion that comes into contact with the first sheet pattern NS1 in a point form, the embodiments are not limited thereto.

FIGS. 28 to 35 are intermediate stage diagrams that illustrate a method of manufacturing the semiconductor device according to some embodiments. For reference, FIGS. 18 to 23 may be the method of manufacturing the semiconductor device described using FIGS. 1 to 6.

Figure 28:
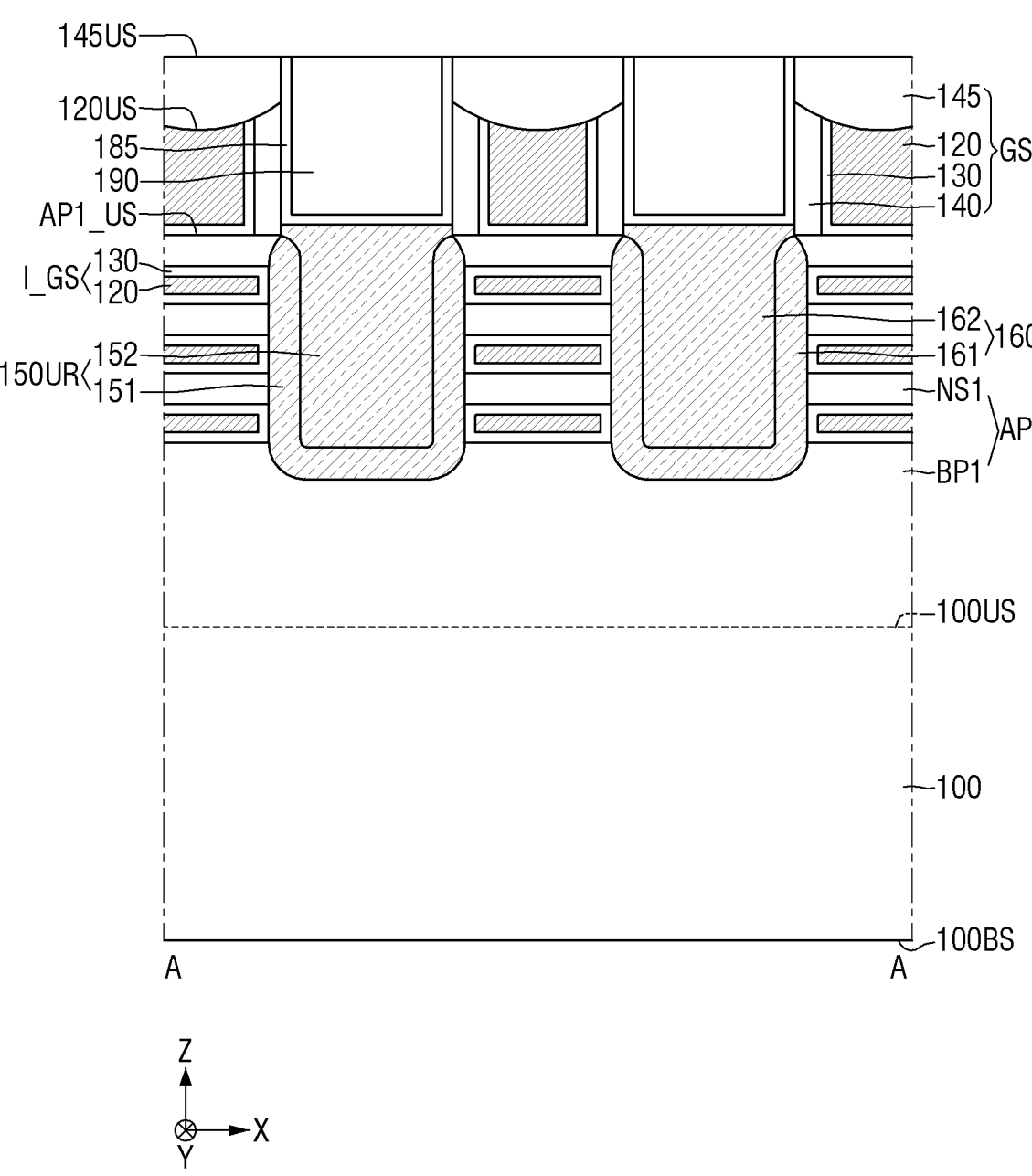
FIGS. 28 to 35 are intermediate stage diagrams that illustrate a method of manufacturing the semiconductor device according to some embodiments.
Figure 29:
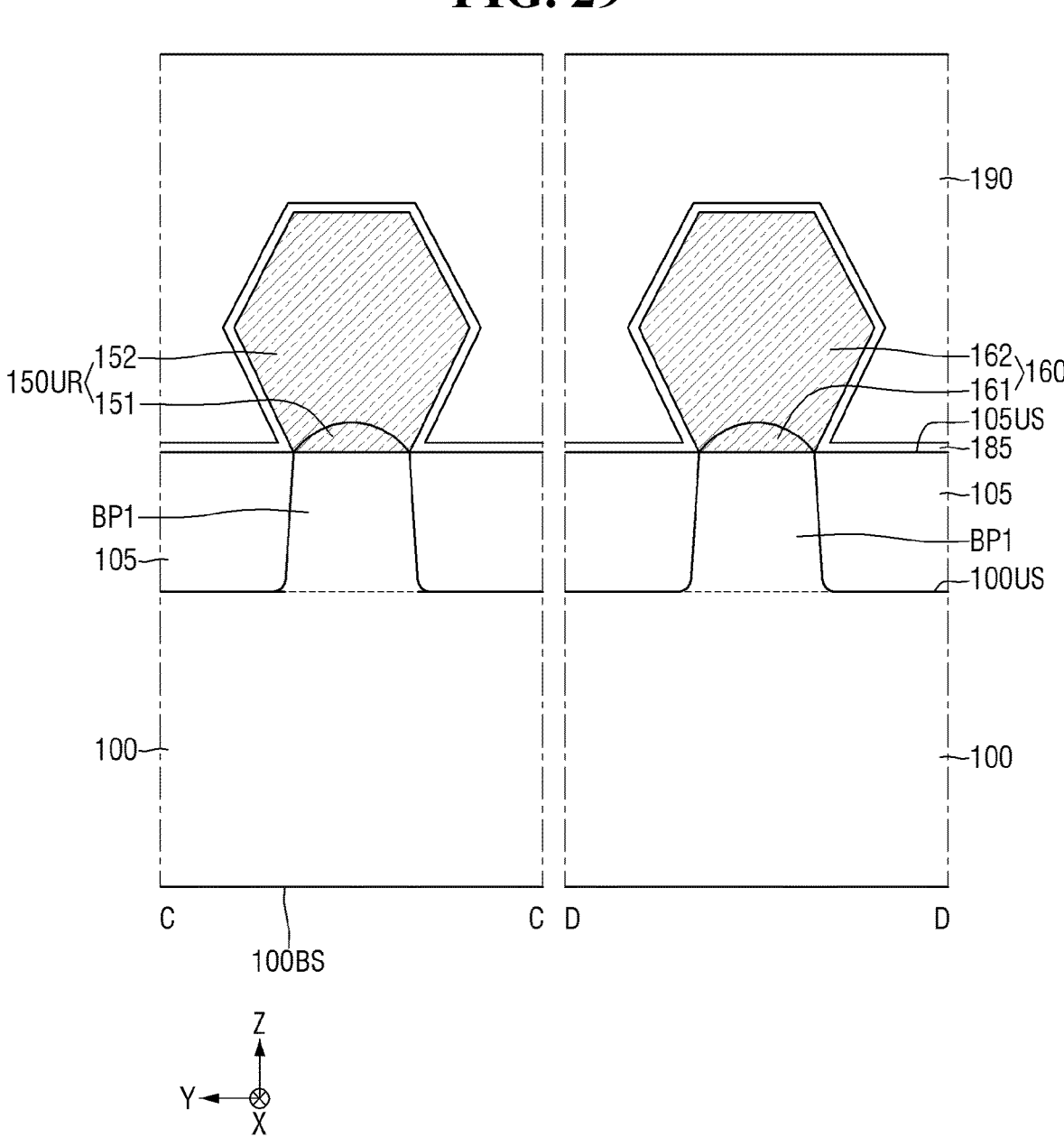

Referring to FIGS. 28 and 29, an upper source/drain region 150UR and a second source/drain pattern 160 are formed on the first lower pattern BP1.

The upper source/drain regions 150UR may include an upper inserted epitaxial region 151 and a first upper epitaxial region 152. The second source/drain pattern 160 may include a second lower epitaxial region 161 and a second upper epitaxial region 162. From the viewpoint of a cross-sectional view such as FIG. 28, the upper inserted epitaxial region 151 and the second lower epitaxial region 161 may have a "U" shape.

The gate spacer 140 may be formed on the first lower pattern BP1 before the upper source/drain region 150UR and the second source/drain pattern 160 are formed.

The source/drain etching stop layer 185 and the first interlayer insulating layer 190 are formed on the upper source/drain region 150UR and the second source/drain pattern 160. Subsequently, a first sheet pattern NS1 is formed on the first lower pattern BP1. As a result, the first active pattern AP1 is formed on the upper surface 100US of the substrate.

Subsequently, the gate insulating layer 130 and the gate electrode 120 that wrap the first sheet pattern NS1 may be formed on the first lower pattern BP1. The gate capping pattern 145 may be formed on the gate electrode 120. Accordingly, the gate structure GS may be formed on the first active pattern AP1. An upper surface 145US of the gate capping pattern may be disposed on the same plane as an upper surface of the first interlayer insulating layer 190 as shown in FIG. 28.

Figure 30:
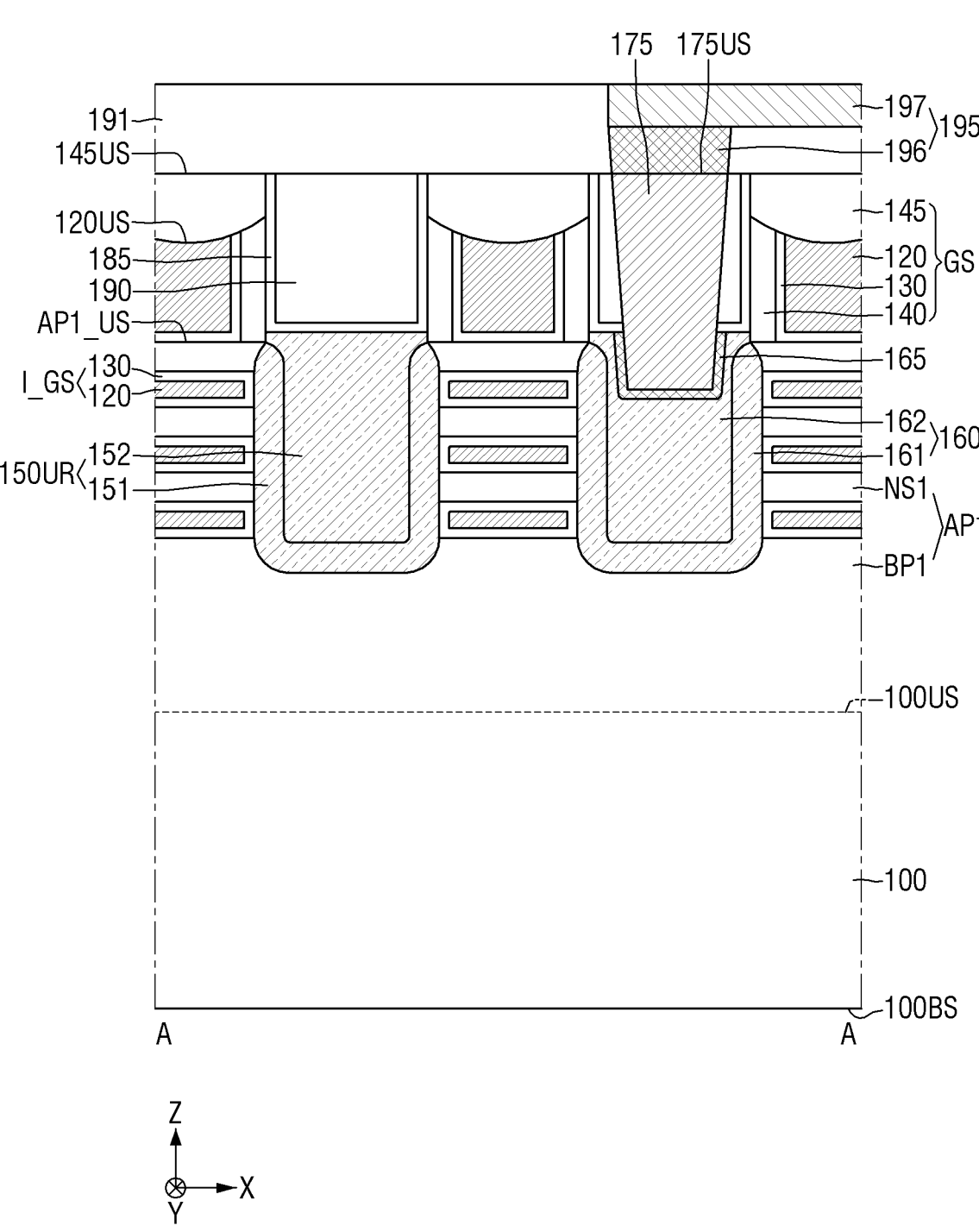
Figure 31:
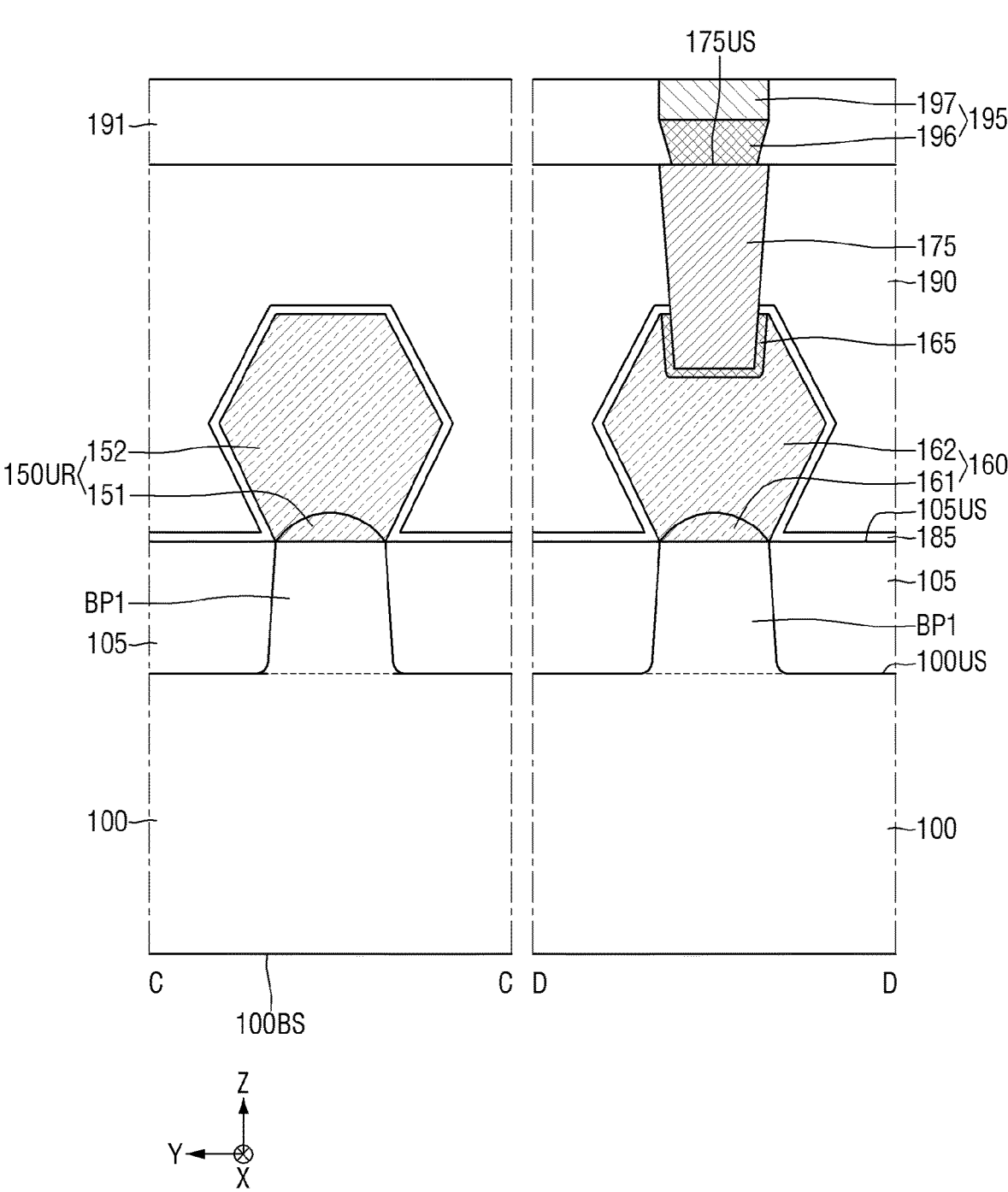

Referring to FIGS. 30 and 31, the first source/drain contact 175 is formed on the upper surface 100US of the substrate.

The first source/drain contact 175 is connected to the second source/drain pattern 160. The second contact silicide layer 165 may be formed on the second source/drain pattern 160 before the first source/drain contact 175 is formed.

The wiring structure 195 is then formed on the gate structure GS and the first source/drain contact 175. The wiring structure 195 may be connected to the first source/drain contact 175.

Figure 32:
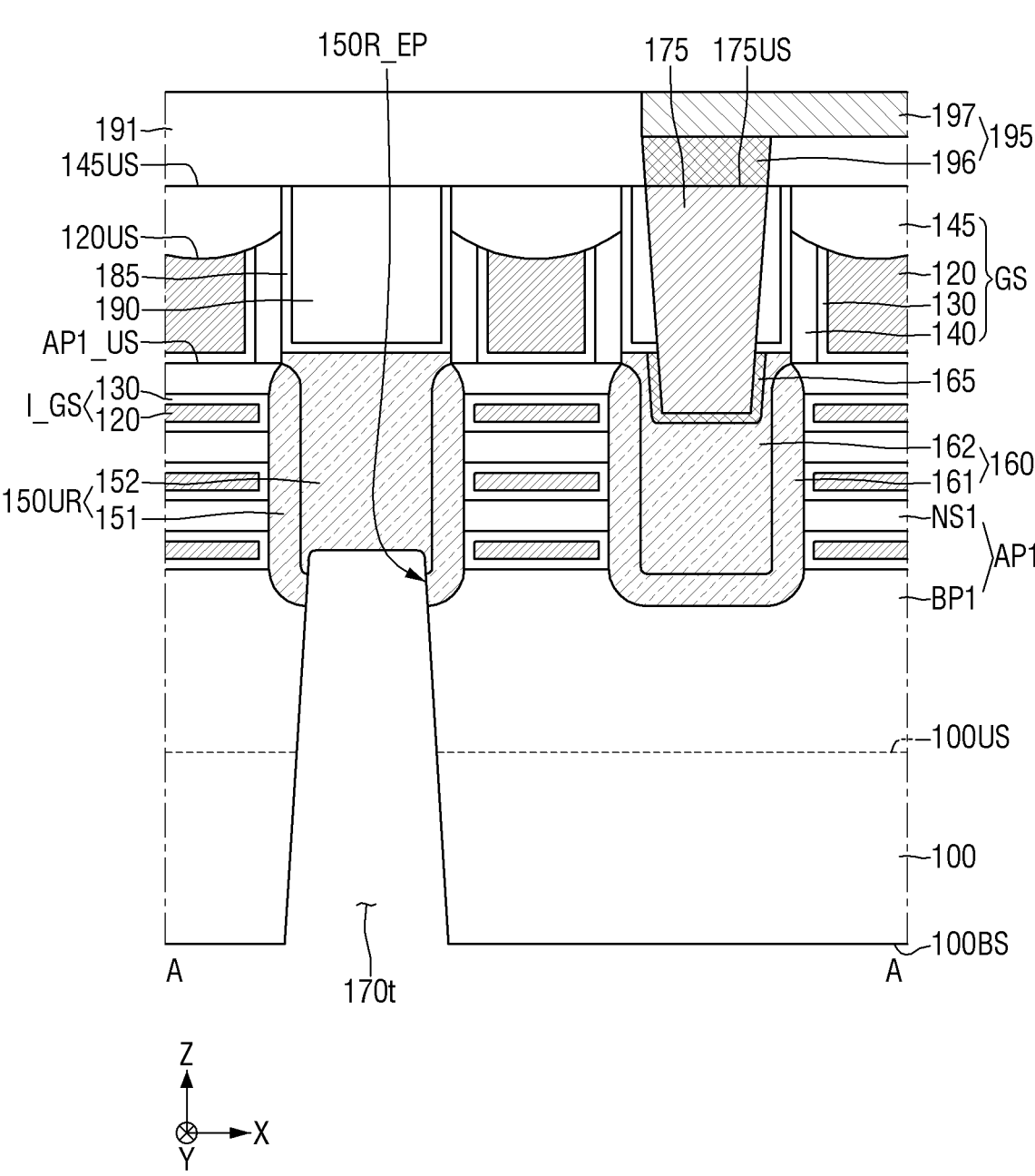
Figure 33:
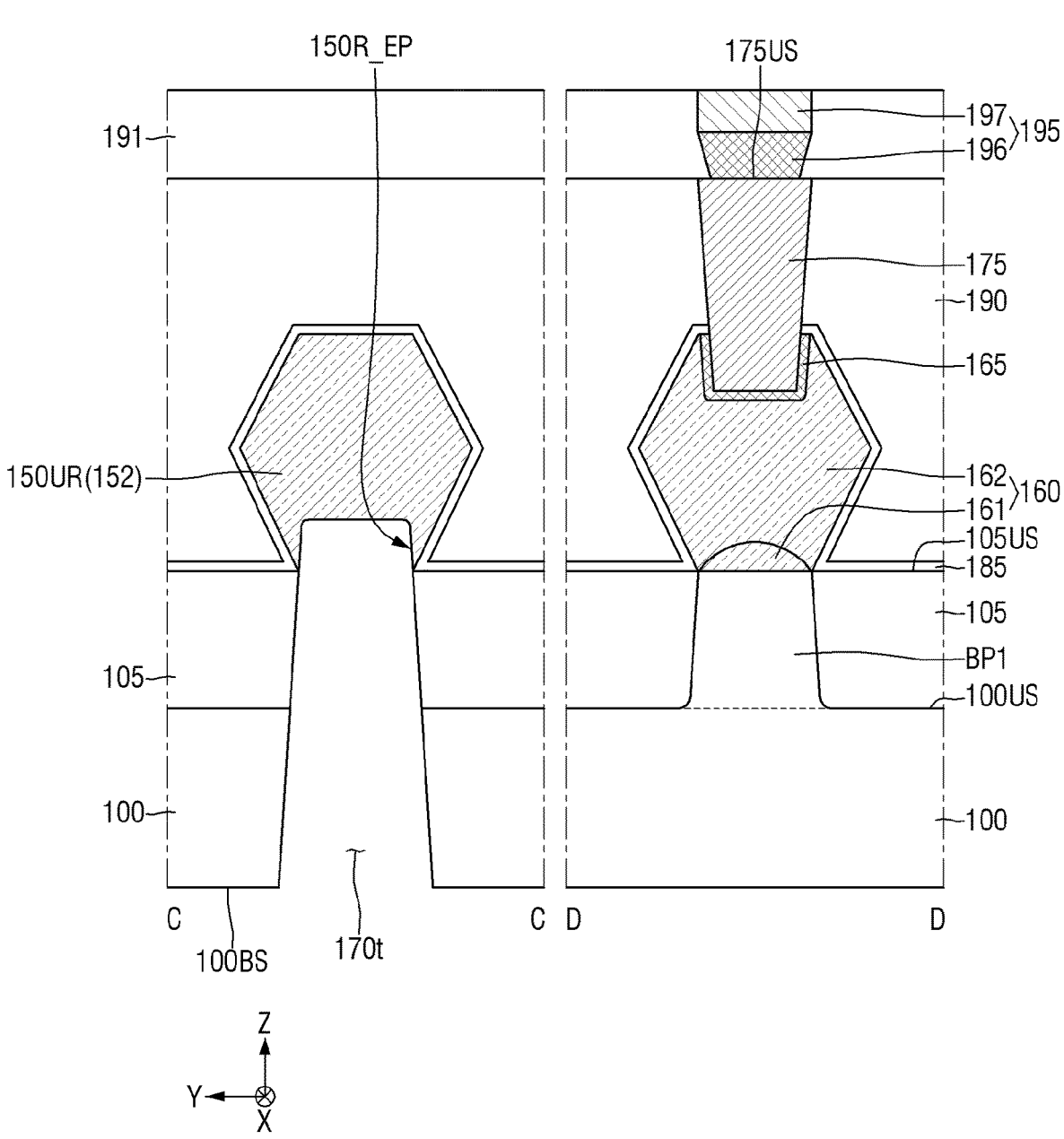

Referring to FIGS. 32 and 33, after forming the wiring structure 195, a part of the substrate 100 is removed and the thickness of the substrate 100 is reduced.

Subsequently, a power contact hole 170t passing through the substrate 100 may be formed. The power contact hole 170t passes through the first lower pattern BP1, and extends to the upper source/drain regions 150UR. The power contact hole 170t exposes the upper source/drain region 150UR. The power contact hole 170t may include an epitaxial recess 150R_EP that is recessed into the upper source/drain region 150UR.

Unlike the shown example, the power contact hole 170t may not include an epitaxial recess 150R_EP. The power contact hole 170t may extend to a boundary between the upper source/drain region 150UR and the first lower pattern BP1.

Figure 34:
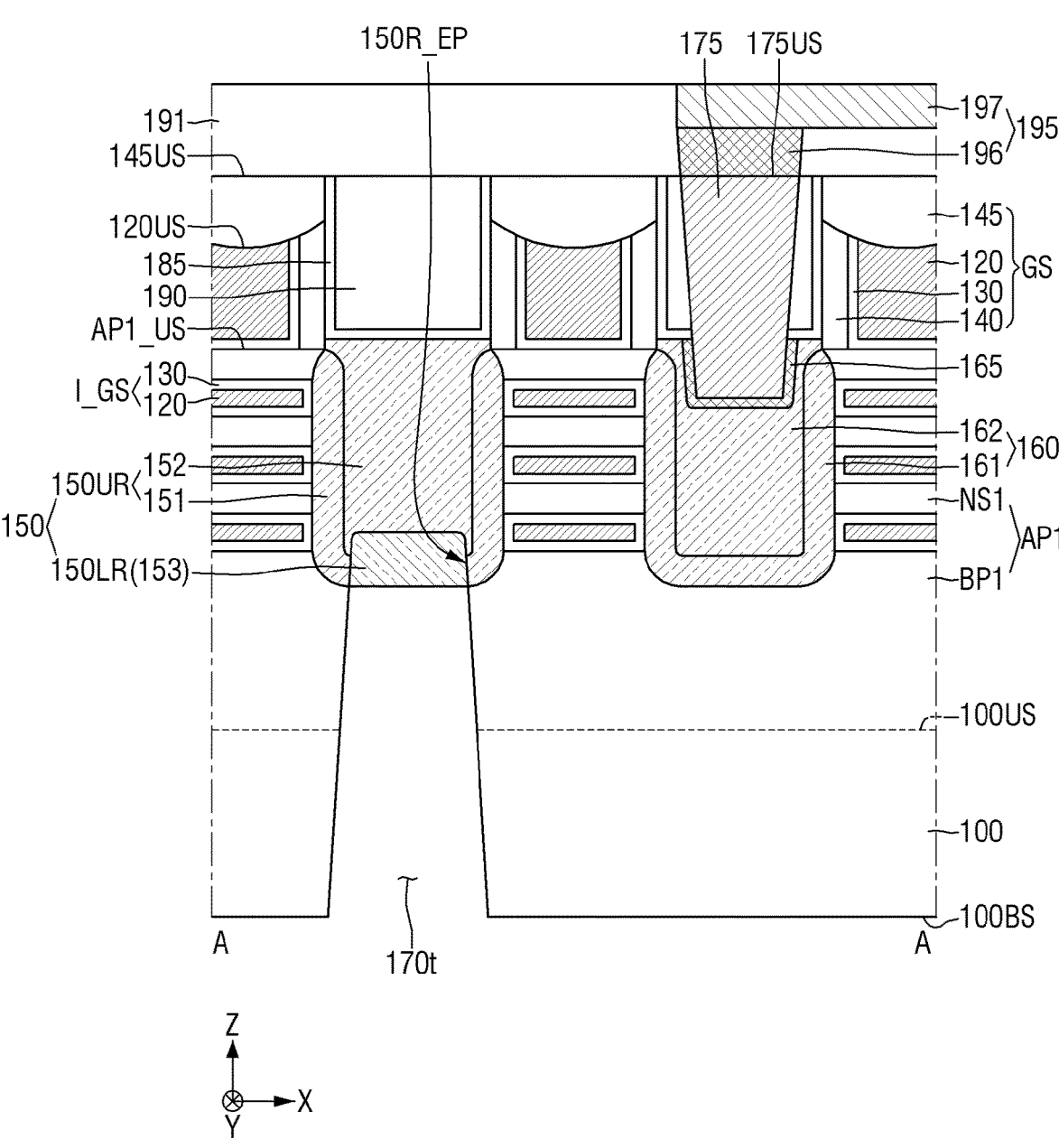
Figure 35:
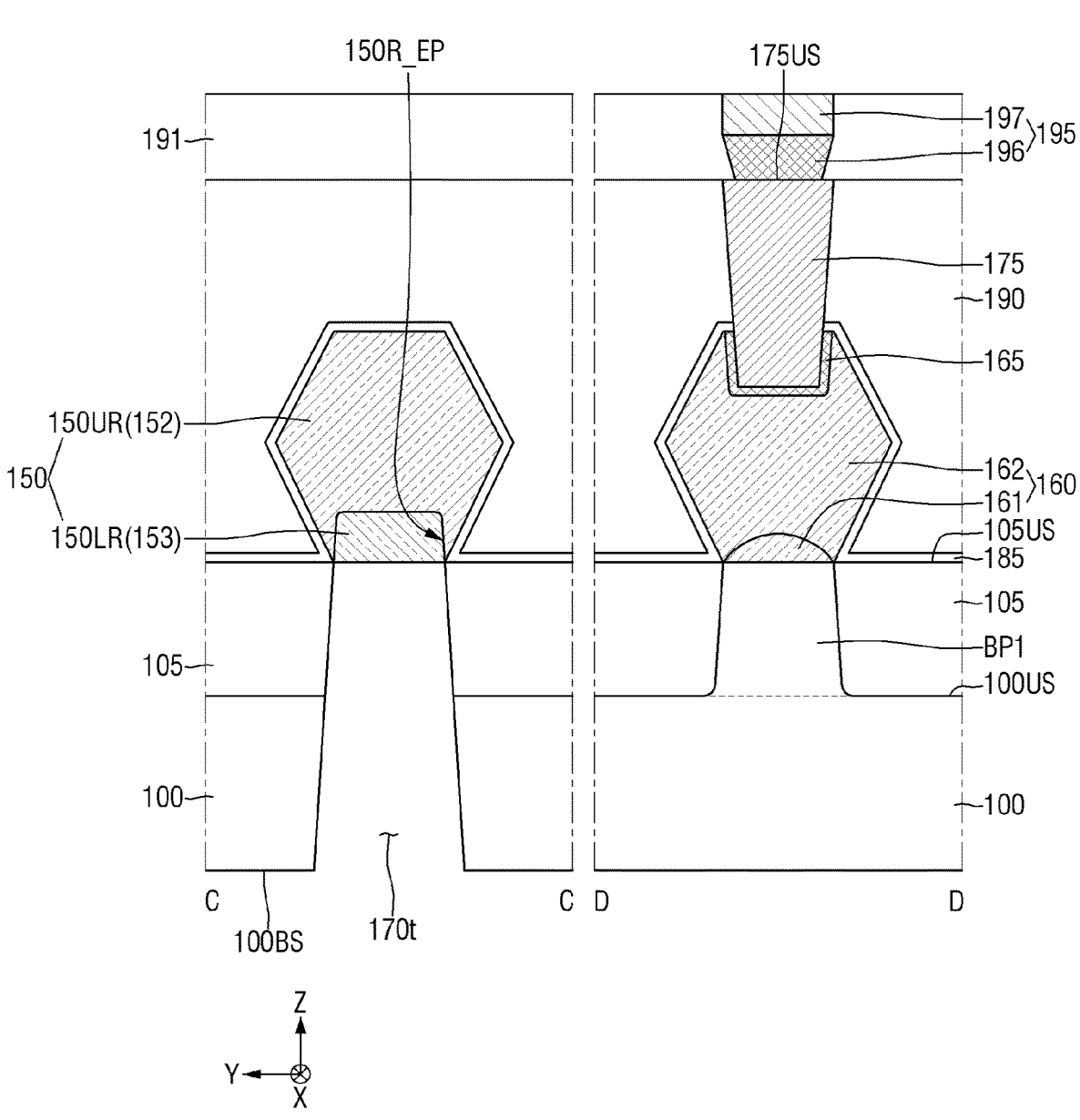

Referring to FIGS. 34 and 35, the first lower epitaxial region 153 is formed in the epitaxial recess 150R_EP, and the first source/drain pattern 150 including the upper source/drain region 150UR and the lower source/drain region 150LR is formed.

The first lower epitaxial region 153 is formed using an epitaxial growth method.

Referring to FIGS. 2 and 4, the first contact silicide layer 155 that comes into contact with the first source/drain pattern 150 may be formed inside the power contact hole 170t. The first power source/drain contact 170 connected to the first contact silicide layer 155 is formed inside the power contact hole 170t.

As an example, the first power source/drain contact 170 may be formed in the power contact holes 170t, using a selective growth method. As another example, the contact barrier layer 171 and the contact plug layer 172 may be sequentially formed, and the first power source/drain contact 170 may be formed in the power contact hole 170t. As yet another example, before forming the first power source/drain contact 170, the contact insulating liner 174 may be formed along the side walls of the power contact hole 170t. The first power source/drain contact 170 may be formed in the power contact hole 170t having the contact insulating liner 174 disposed therein.

Subsequently, the first power line 50 and the second power line 60 may be formed on the lower surface 100BS of the substrate.

While example embodiments have been shown and described above, it will be apparent to those skilled in the art that modifications and variations could be made without departing from the scope of the present inventive concept as defined by the appended claims.

What is claimed is:

1. A semiconductor device comprising:
a substrate including an upper surface and a lower surface that are opposite to each other in a first direction;
an active pattern, which is on the upper surface of the substrate and extends in a second direction;
a gate electrode, which is on the active pattern and extends in a third direction;
a first source/drain pattern, which is connected to the active pattern on the upper surface of the substrate, and includes a lower epitaxial region and an upper epitaxial region, the upper epitaxial region including an epitaxial recess, and the lower epitaxial region being inside the epitaxial recess;
a first source/drain contact, which is connected to the first source/drain pattern and extends into the substrate; and
a contact silicide layer, which is between the first source/drain contact and the first source/drain pattern and contacts the lower epitaxial region.

2. The semiconductor device of claim 1,
wherein the first source/drain pattern further includes an inserted epitaxial region between the upper epitaxial region and the lower epitaxial region, and
wherein a concentration of dopant included in the inserted epitaxial region is lower than a concentration of dopant included in the upper epitaxial region and a concentration of dopant included in the lower epitaxial region.

3. The semiconductor device of claim 1, further comprising:
a contact insulating liner which is between the first source/drain contact and the substrate,
wherein the contact insulating liner extends along side walls of the first source/drain contact.

4. The semiconductor device of claim 1,
wherein the first source/drain contact has a single conductive layer structure.

5. The semiconductor device of claim 1,
wherein the first source/drain contact includes a contact barrier layer and a contact plug layer, and
wherein the contact barrier layer is between the contact silicide layer and the contact plug layer, and on a side wall of the contact plug layer.

6. The semiconductor device of claim 5,
wherein the contact barrier layer includes a first sub-barrier layer and a second sub-barrier layer,
wherein the first sub-barrier layer is between the contact plug layer and the second sub-barrier layer,
wherein the contact silicide layer includes a metal silicide material, and
wherein a metal included in the metal silicide material is identical to a metal included in the second sub-barrier layer.

7. The semiconductor device of claim 1, further comprising:
a power line on the lower surface of the substrate,
wherein the first source/drain contact connects the first source/drain pattern and the power line.

8. The semiconductor device of claim 1, further comprising:
a second source/drain pattern on the active pattern;
a wiring structure on the upper surface of the substrate; and
a second source/drain contact, which connects the wiring structure and the second source/drain pattern,
wherein the gate electrode is between the first source/drain pattern and the second source/drain pattern.

9. The semiconductor device of claim 1,
wherein the active pattern includes a lower pattern protruding from the upper surface of the substrate, and a sheet pattern spaced apart from the lower pattern in the first direction, and
wherein the gate electrode at least partially wraps the sheet pattern.

10. A semiconductor device comprising:
a substrate including an upper surface and a lower surface that are opposite to each other in a first direction;
an active pattern, which is on the upper surface of the substrate and extends in a second direction;
a gate electrode, which is on the active pattern and extends in a third direction;
a first source/drain pattern, which is connected to the active pattern on the upper surface of the substrate, and includes a first lower epitaxial region, a first upper epitaxial region, and an inserted epitaxial region, the inserted epitaxial region being between the first lower epitaxial region and the first upper epitaxial region;

23 a first source/drain contact, which is connected to the first source/drain pattern and extends into the substrate; and a contact silicide layer, which is between the first source/drain contact and the first source/drain pattern, and contacts the first lower epitaxial region, wherein a concentration of dopant included in the inserted epitaxial region is lower than a concentration of dopant included in the first upper epitaxial region and a concentration of dopant included in the first lower epitaxial region.

11. The semiconductor device of claim 10, wherein the first upper epitaxial region includes an epitaxial recess, and the inserted epitaxial region and the first lower epitaxial region are inside the epitaxial recess.

12. The semiconductor device of claim 10, further comprising:

a second source/drain pattern on the active pattern;

a wiring structure on the upper surface of the substrate; and a second source/drain contact, which connects the wiring structure and the second source/drain pattern, wherein the gate electrode is between the first source/drain pattern and the second source/drain pattern.

13. The semiconductor device of claim 12, wherein the second source/drain pattern includes a second lower epitaxial region and a second upper epitaxial region on the second lower epitaxial region, wherein the second lower epitaxial region contacts the active pattern, and wherein a concentration of dopant included in the second upper epitaxial region is higher than a concentration of dopant included in the second lower epitaxial region.

14. The semiconductor device of claim 12, wherein a height from the lower surface of the substrate to a lowest part of the first source/drain pattern is less than a height from the lower surface of the substrate to a lowest part of the second source/drain pattern.

15. The semiconductor device of claim 10, further comprising:

a power line on the lower surface of the substrate, wherein the first source/drain contact connects the first source/drain pattern and the power line.

16. The semiconductor device of claim 10, further comprising:

a contact insulating liner between the first source/drain contact and the substrate, wherein the contact insulating liner extends along side walls of the first source/drain contact, and wherein the first source/drain contact has a single conductive layer structure.

17. A semiconductor device comprising:

a substrate including an upper surface and a lower surface that are opposite in a first direction;

a lower pattern, which protrudes from the upper surface of the substrate;

24 a sheet pattern, which is spaced apart from the lower pattern in the first direction, and includes a first end and a second end;

a gate electrode, which extends in a second direction on the upper surface of the substrate, and at least partially wraps the sheet pattern;

a first source/drain pattern, which is in contact with the lower pattern, connected to the first end of the sheet pattern, and includes a first lower epitaxial region and a first upper epitaxial region, the first upper epitaxial region including an epitaxial recess, and the first lower epitaxial region being inside the epitaxial recess;

a second source/drain pattern, which is in contact with the lower pattern and connected to the second end of the sheet pattern, and includes a second lower epitaxial region, and a second upper epitaxial region on the second lower epitaxial region;

a first source/drain contact, which is connected to the first source/drain pattern and extends into the substrate;

a second source/drain contact, which is on the upper surface of the substrate and connected to the second source/drain pattern;

a first contact silicide layer, which is between the first source/drain contact and the first source/drain pattern, and contacts the first lower epitaxial region; and a second contact silicide layer, which is between the second source/drain contact and the second source/drain pattern, and contacts the second upper epitaxial region.

18. The semiconductor device of claim 17, further comprising:

a power line on the lower surface of the substrate; and a wiring structure on the upper surface of the substrate, wherein the first source/drain contact connects the power line and the first source/drain pattern, and wherein the second source/drain contact connects the wiring structure and the second source/drain pattern.

19. The semiconductor device of claim 17, wherein the first source/drain pattern further includes an inserted epitaxial region between the first upper epitaxial region and the first lower epitaxial region, and wherein a concentration of dopant included in the inserted epitaxial region is lower than a concentration of dopant included in the first upper epitaxial region and a concentration of dopant included in the first lower epitaxial region.

20. The semiconductor device of claim 17, further comprising:

a contact insulating liner between the first source/drain contact and the substrate, wherein the contact insulating liner extends along side walls of the first source/drain contact, and wherein the first source/drain contact has a single conductive layer structure.

* * * * *